United States Patent
Alsaggaf et al.

(10) Patent No.: US 11,308,349 B1
(45) Date of Patent: Apr. 19, 2022

(54) METHOD TO MODIFY ADAPTIVE FILTER WEIGHTS IN A DECENTRALIZED WIRELESS SENSOR NETWORK

(71) Applicant: King Abdulaziz University, Jeddah (SA)

(72) Inventors: Abdulrahman U. Alsaggaf, Jeddah (SA); Ubaid M. Al-Saggaf, Jeddah (SA); Muhammad Moinuddin, Jeddah (SA); Muhammad Arif, Karachi (PK); Imran Naseem, Karachi (PK)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 17/502,593

(22) Filed: Oct. 15, 2021

(51) Int. Cl.
*G06K 9/00* (2022.01)
*G06K 9/62* (2022.01)

(52) U.S. Cl.
CPC ........... *G06K 9/6223* (2013.01); *G06K 9/623* (2013.01); *G06K 9/6235* (2013.01)

(58) Field of Classification Search
CPC .... G06K 9/623; G06K 9/6235; G06K 9/6223; G06T 5/001; G06T 5/20; G06T 5/50;
(Continued)

(56) References Cited

U.S. PATENT DOCUMENTS

| 5,768,307 | A | * | 6/1998 | Schramm | ............... | H04B 1/707 |
| | | | | | | 375/150 |
| 7,428,020 | B2 | * | 9/2008 | Lin | ........................ | G06T 5/50 |
| | | | | | | 348/607 |

(Continued)

FOREIGN PATENT DOCUMENTS

CN       110061720 A       7/2019

OTHER PUBLICATIONS

Scardapane, et al.; Diffusion Spline Adaptive Filtering; 2016 24th European Signal Processing Conference; 5 Pages.

*Primary Examiner* — Amir Alavi
(74) *Attorney, Agent, or Firm* — Oblon, McClelland, Maier & Neustadt, L.L.P.

(57) ABSTRACT

A method and a system of distributed estimation using q-diffusion least mean squares (qDiff-LMS) to modify adaptive filter weights in a decentralized wireless sensor network of N nodes is described. The method includes receiving, at each node, k, a local estimate of a previous time instance weight, $w_k(i-1)$, of an adaptive filter of each neighboring node, l, where l=1, 2, ..., M, combining the local estimates of the previous time instance weights to generate a linear combination of global diffused weights, $\emptyset_k(i-1)$, measuring, for each node k, an output, $y_k(i)$, of the adaptive filter of the node k, calculating, for each node k, a desired response, $d_k(i)$; generating, for each node k, an estimation error, $e_k^{CTA}(i)$ by subtracting the output, $y_k(i)$ from the desired response, $d_k(i)$, and updating the global diffused weights by adding a portion of the estimated error to the global diffused weights.

20 Claims, 14 Drawing Sheets

(58) Field of Classification Search
CPC .................. G06T 3/4038; G06T 11/60; G06T 2207/20012; H04N 1/3876; H04N 5/23238; H04N 7/26888; H04N 7/26058; H04N 7/21

See application file for complete search history.

(56) References Cited

U.S. PATENT DOCUMENTS

| | | | |
|---|---|---|---|
| 7,821,578 B2* | 10/2010 | Pathak | H04N 17/04 348/607 |
| 8,462,892 B2 | 6/2013 | Zerguine et al. | |
| 8,503,814 B2* | 8/2013 | Ayzenberg | G06T 5/003 382/261 |
| 8,660,281 B2* | 2/2014 | Bouchard | H04R 25/43 381/312 |
| 8,903,685 B2 | 12/2014 | Saeed et al. | |
| 9,361,677 B2* | 6/2016 | Kauff | H04N 13/106 |
| 9,576,345 B2* | 2/2017 | Mailhe | G06T 5/10 |
| 11,017,504 B2* | 5/2021 | Trejo | G06T 5/002 |
| 2013/0034243 A1* | 2/2013 | Yermeche | 381/94.1 |

* cited by examiner

METHOD TO MODIFY ADAPTIVE FILTER WEIGHTS IN A DECENTRALIZED WIRELESS SENSOR NETWORK

BACKGROUND

Technical Field

The present disclosure is directed to a method and a system for distributed estimation of adaptive filter weights using q-diffusion least mean squares (qDiff-LMS) to modify adaptive filter weights in a decentralized wireless sensor network.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Diffusion least mean squares (D-LMS) is a well-known algorithm for distributed estimation where estimation takes place at multiple nodes. According to a distributed estimation process, information is retrieved from geographically distributed nodes to estimate unknown parameters based on communication with other nodes. Further, D-LMS is based on diffusion technology. In diffusion topology, each node collects and processes its data individually and broadcasts the estimation to all the nodes present in the network. In D-LMS, the estimates of nodes are exchanged among the neighbors and then fused via linear combinations. However, D-LMS has a slow convergence speed due to its gradient descent-based design.

Accordingly, it is one object of the present disclosure to provide a control system and methods for D-LMS with improved convergence performance.

SUMMARY

In an exemplary embodiment, a method of distributed estimation using q-diffusion least mean squares (qDiff-LMS) to modify adaptive filter weights in a decentralized wireless sensor network of N nodes is disclosed. The method includes receiving, at each node, k, a local estimate of a previous time instance weight, $w(i-1)$ of an adaptive filter of each neighboring node, l, where $l=1, 2, \ldots, M$, combining the local estimates of the previous time instance weights to generate a linear combination of global diffused weights, $\phi_k(i-1)$ measuring, for each node k, an output, $y_k(i)$, of the adaptive filter of the node k, calculating, for each node k, a desired response, $d_k(i)$, generating, for each node k, an estimation error, $e_k^{CTA}(i)$ by subtracting the output, $y_k(i)$ from the desired response, $d_k(i)$, and updating the global diffused weights by adding a portion of the estimated error to the global diffused weights.

In another exemplary embodiment, a method of distributed estimation using qDiff-LMS to modify adaptive filter weights in a decentralized wireless sensor network of N nodes is disclosed. The method includes calculating an output, $y_k(i)$, of an adaptive filter of each node k, based on a product of a measured position, $x_k(i)$ of the node k, and an estimate of a previous time instance weight, $w(i-1)$ of each adaptive filter, calculating, for each node, k, a desired response, $d_k(i)$, calculating, for each node k, an estimation error, $e_k^{ATC}(i)$ by subtracting the output, $y_k(i)$ from the desired response, $d_k(i)$, updating the local estimate of the previous time instance weight, $w(i-1)$, of the adaptive filter at each node k by adding a portion of the estimation error to the previous time instance weight, thus generating a local estimate of a diffused weight, $\theta_k(i-1)$, receiving, at each node k, the local estimate of the diffused weight, $(i-1)$, from each neighboring node l, where $l=1, 2, \ldots, M$, and combining the local estimates of the diffused weights, $\theta_k(i-1)$, in a linear combination, thus generating a global diffused weight, $W(i-1)$.

In yet another exemplary embodiment, a system for distributed estimation of adaptive filter weights using qDiff-LMS to modify adaptive filter weights in a decentralized wireless sensor network of N nodes is disclosed. The system includes a decentralized wireless sensor network of N nodes, wherein each node k of the N nodes is defined by a position coordinate, $x_k(i)$, an adaptive filter located in each node k of the N nodes, wherein the adaptive filter is represented by a plurality of weights, a computing device located in each node k, wherein the computing device includes circuitry and program instructions, which when executed by at least one processor, are configured to calculate an output, $y_k(i)$, of the adaptive filter of the node k, based on a product of a measured position, $x_k(i)$ of the node k, and an estimate of a previous time instance weight, $w(i-1)$, of each adaptive filter, calculate, for each node k, a desired response, $d_k(i)$, generate, for each node k, an estimation error, $e_k(i)$, by subtracting the output, $y_k(i)$ from the desired response, $d_k(i)$, generate one of a linear combination global diffused weights, $\theta_k(i-1)$, based on receiving, at each node k, a local estimate of a previous time instance weight, $w(i-1)$, of an adaptive filter of each neighboring node, l, where $l=1, \ldots, M$, and a linear combination of global diffused weights, $\theta_k(i-1)$, based on receiving, at each node k, a local estimate of the diffused weight, $\theta_l(i-1)$, calculated by each neighboring node l, and updating one or more of the previous time instance weights, $w(i-1)$, of each adaptive filter, and the local estimate of the diffused weights, $\theta_l(i-1)$.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
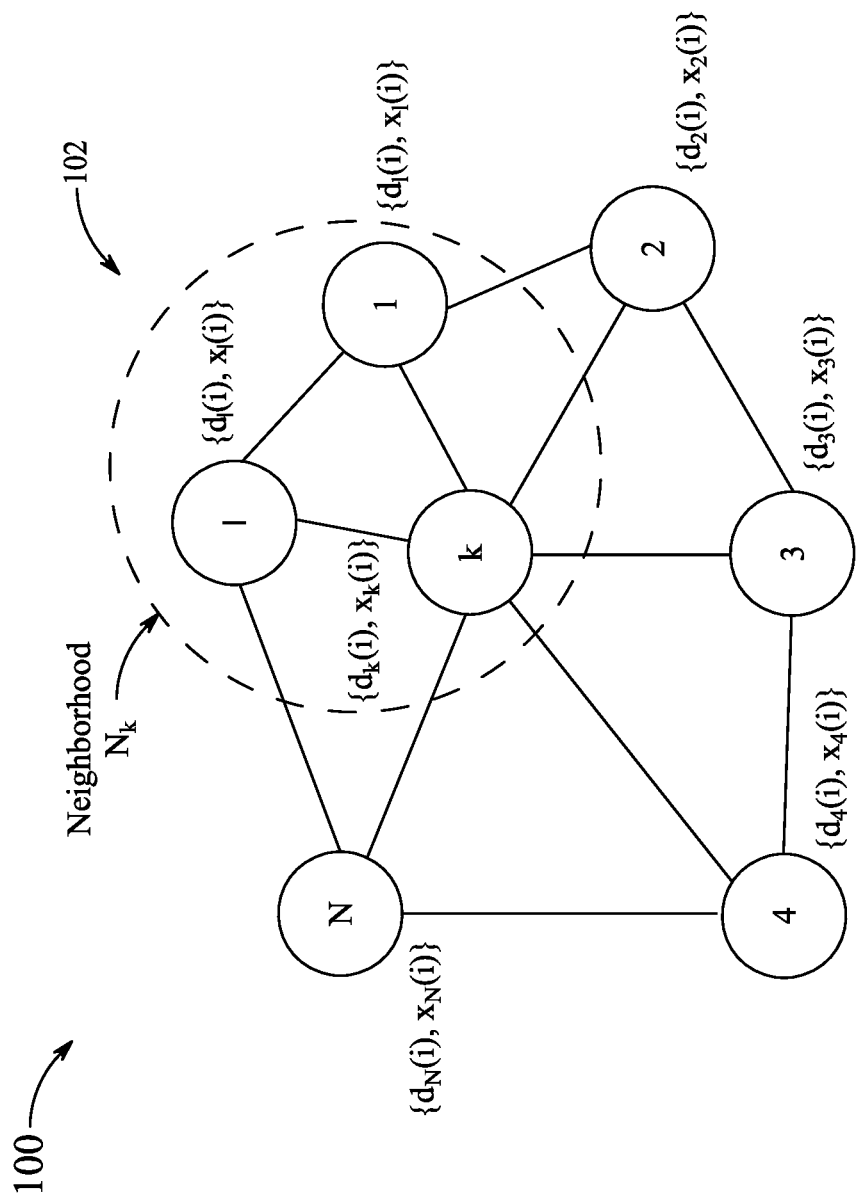
FIG. 1A illustrates a system for distributed estimation of adaptive filter weights using q-diffusion least mean squares (qDiff-LMS) to modify adaptive filter weights, according to aspects of the present disclosure.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a control system and methods for distributed estimation using q-calculus-aided diffusion least mean squares (LMS). The present disclosure describes modified diffusion LMS with improved convergence performance by employing a q-calculus based gradient. Further, the present disclosure is based on signal processing (for example, by Bounded Perturbation Regularization (BPR)) applied to a telecommunications engineering application such as distributed estimation in wireless sensor networks.

Figure 1B:
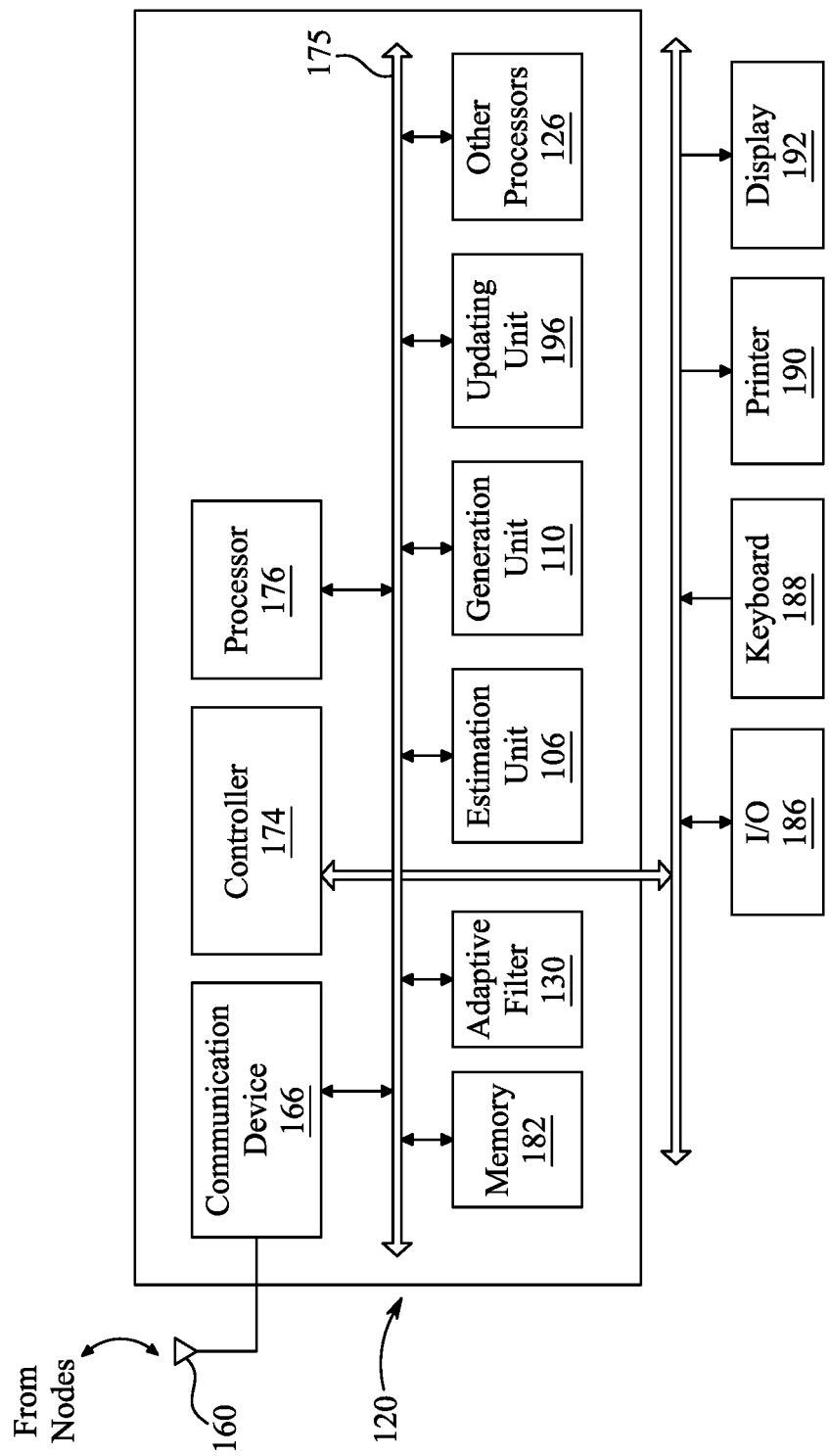
FIG. 1B illustrates a computing device of the system that performs distributed estimation using qDiff-LMS, according to aspects of the present disclosure.

FIG. 1A illustrates a system 100 for distributed estimation of adaptive filter weights using q-diffusion least mean squares (qDiff-LMS) to modify adaptive filter weights in a decentralized wireless sensor network 102 of N nodes, and FIG. 1B shows a computing device 120 which may be included in node k of the N nodes.

According to an aspect of the present disclosure, the system 100 includes a decentralized wireless sensor network 102 of N nodes. Each node k of the N nodes is defined by a position coordinate, $x_k(i)$. The system 100 further includes an adaptive filter (130, shown in FIG. 1B) located in each node k of the N nodes. The adaptive filter 130 is represented by a plurality of weights. The system 100 further includes a computing device (120, shown in FIG. 1B) located in each node k. The computing device 120 includes circuitry and program instructions. The computing device 120 is configured to calculate an output, $y_k(i)$, of the adaptive filter 130 of the node k, based on a product of a measured position, $x_k(i)$, of the node k. Further, the computing device 120 is configured to calculate an estimate of a previous time instance weight, $w(i-1)$, of each adaptive filter 130. In an example, $x_k(i)$ is an input signal vector of size 1×M at the $k^{th}$ node.

The computing device 120 is configured to calculate a desired response, $d_k(i)$, for each node k. Each node k has access to time realization $\{d_k(i), x_k(i)\}$, of zero mean spatial data $\{d, X\}$ such that k=1, 2, ..., N. According to an aspect, global matrices of input and measured data at a time instant i of the decentralized wireless sensor network 102 of N nodes are given by equation (1), provided below.

$$\begin{rcases} X = \{x_1, x_2, \ldots, x_N\} & (N \times M) \\ d = \{d_1, d_2, \ldots, d_N\} & (N \times 1) \end{rcases} \quad (1)$$

The computing device 120 is configured to generate an estimation error, $e_k(i)$, for each node k. In an example, the computing device 120 is configured to generate the estimation error, $e_k(i)$, by subtracting the output, $y_k(i)$, from the desired response, $d_k(i)$.

Further, the computing device 120 is configured to generate an estimation error e based on equation (2), provided below.

$$e = d - Xw, \quad (2)$$

where, e is the estimation error that represents the difference between desired response and measured output and w is an estimated weight vector of the adaptive filter 130 of size M×1.

The computing device 120 is configured to generate a cost function, J(w), of the weights of the adaptive filter 130 of the N nodes in the decentralized wireless sensor network 102. In an example, the computing device 120 is configured to generate the cost function, J(w), based on equation (3), provided below:

$$J(w) = E[\|e\|^2], \quad (3)$$

where, E[.] is the expectation operator and e is the estimation error. According to probability theory, the expectation of a random variable A (denoted as E[A]) is a generalization of weighted average, and is an arithmetic mean of a large number of independent realizations of A.

Also, the computing device 120 is configured to minimize the cost function, J(w), based on equation (4), provided below:

$$\min_w J(w) = E[\|d - Xw\|^2].  \quad (4)$$

where E is an expectation operator of an absolute value of a least mean square error of the estimated output.

The cost function, J(w), (given by equation (3)) can be rewritten or broken down as:

$$J(w) = \sum_{k=1}^{N} J_k(w).  \quad (5)$$

Accordingly, J(w) is the sum of N local cost functions $J_k(w)$, one for each node k and it is given by equation (6), provided below:

$$J_k(w(i)) = E[|e_k(i)|^2] = E[|d_k(i) - x_k(i)w(i)|^2].  \quad (6)$$

A conventional gradient based steepest descent optimization method for determining an optimal weight vector, w°, in case of a centralized estimation is evaluated using equation (7), provided below.

$$w(i) = w(i-1) - \mu \sum_{k=1}^{N} \nabla J_k(w(i-1)),  \quad (7)$$

$$w(-1) = \text{initial condition}$$

where, $\mu > 0$ is step-size, w(i) is an estimate of w° at iteration i and $\Delta J_k(w(i-1))$ denotes the gradient vector of $J_k(w(i-1))$ with respect to w evaluated at w(i−1).

According to an incremental topology, each node k has access to the preceding node k−1. Further, $\psi_k(i)$ denotes a local estimate of w° at node k and time i. Therefore, the node k has access to the estimate from the preceding node i.e., $\psi_{k-1}(i)$.

At each time instant i, the initial condition $\psi_0(i)$ for node 1 is the global estimate w(i−1) (i.e., the estimated weight vector of last node from the previous iteration). The estimate cyclically across the network for each node k and at the end of procedure for the local estimate at last node $\psi_N(i)$ will coincide with the current global estimate w(i). Although the distributed estimation via the incremental strategy has lower computational complexity as each node is accessing the estimate from only one node, its performance is poor in comparison to the diffusion based estimation.

In diffusion based estimation, every node k in the network combines estimates from its neighborhood. For example, at any given time i−1, the $k^{th}$ node can receive weights $w_{k \in N_k}(i-1)$ from its neighborhood node $N_k$. Accordingly, in diffusion based estimation, the local estimates of individual nodes are fused in a linear combination manner at node k as follows:

$$\phi_k(i-1) = \sum_{l \in N_k} c_{kl} w_l(i-1);  \quad (8)$$

where, $c_{kl}$ is a combining coefficient and is mathematically expressed using equation (9), provided below.

$$c_{kl} = \frac{1}{N_k}, \forall k,  \quad (9)$$

where, $N_k$ is a sum of the nodes in the neighborhood of the node k and $\forall k$ means "for all instances of k", where $c_{kl} \geq 0$ and is chosen to improve overall estimation performance.

The estimate of the next time step i for node k has conventionally been obtained by employing the conventional gradient based steepest descent optimization method, which is given by equation (10), provided below.

$$w(i) = \phi_k(i-1) - \mu \nabla_{\phi_k} J_k(\phi_k(i-1)).  \quad (10)$$

Accordingly, the weight update at node k is achieved using the gradient based approach given in equation (10) with $J_k(\phi_k(i-1)) = E[|d_k(i) - x_k(i)\phi_k(i-1)|^2]$.

Alternatively, for evaluating $\nabla_{\phi_k} J_k \phi_k(i-1)$, a conventional calculus based derivative has also been used which results in a weight update rule provided by equation (11), given below:

$$w(i) = \phi_k(i-1) + \mu x_k^T(i)(d_k(i) - x_k(i)\phi_k(i-1)),  \quad (11)$$

where, $\mu$ is a fixed step size of the steepest descent optimization and T represents a transpose of $x_k(i)$.

Accordingly, the conventional diffusion LMS can be summarized in equation (12), provided below.

$$\begin{cases} \phi_k(i-1) = \sum_{l \in N_k} c_{kl} w_l(i-1), \text{combining step} \\ w_k(i) = \phi_k(i-1) + \mu x_k^T(i)(d_k(i) - x_k(i)\phi_k(i-1)), \text{Adaptation Step} \end{cases}  \quad (12)$$

According to an aspect, the present disclosure employs the q-derivative for evaluating the gradient of equation (7). The q-derivative of a function f(x) with respect to variable x, denoted by $D_{q,x}f(x)$ is defined in equation (13), provided below:

$$D_{q,x}f(x) \triangleq \begin{cases} \dfrac{f(qx) - f(x)}{qx - x}, & \text{if } x \neq 0, \\ \dfrac{df(0)}{dx} & x = 0, \end{cases}  \quad (13)$$

where, q is a real positive number which cannot be equal to unity.

Based on the concepts described above, the q-gradient of a function f(x) of n variables with $x = [x_1, x_2, \ldots, x_n]^T$ can be expressed using equation (14), provided below:

$$\nabla_{q,x} f(x) \triangleq [D_{q1,x1}f(x), D_{q2,x2}f(x), \ldots, D_{qn,xn}f(x)]^T,  \quad (14)$$

where, $q = [q_1, q_2, \ldots, q_n]^T$.

Application of the q-gradient results in a weight update rule provided by equation (15), given below:

$$w(i) = w(i-1) + \mu G x(i)e(i),  \quad (15)$$

where G is a diagonal matrix having q-parameters on a diagonal, where the diagonal is given by:

$$\text{diag}(G) = \left[\frac{(q_1+1)}{2}, \frac{(q_2+1)}{2}, \ldots, \frac{(q_M+1)}{2}\right]^T.  \quad (16)$$

Further, the conventional gradient provided by equation (10) can be replaced by the q-gradient to obtain:

$$w_k(i) - \emptyset_k(i-1) - \mu \nabla_{q,\emptyset_k} J_k(\emptyset_k(i-1)), \quad (17)$$

where, $\nabla_{q,\emptyset_k}$ represent the q-gradient with respect to vector $\emptyset_k$.

Using the expression of the q-gradient provided by equation (14), weight recursion for the node k can be evaluated using equation (18), provided below.

$$w_k(i) = \emptyset_k(i-1) + \mu G_k x_k^T(i)(d_k(i) - x_k(i)\emptyset_k(i-1)) \quad (18)$$

where, $G_k$ is a diagonal matrix having q-parameters for the node k on a diagonal, and where the diagonal is given by equation (19), provided below.

$$\text{diag}(G_k) = \left[\frac{(q_{k1}+1)}{2}, \frac{(q_{k2}+1)}{2}, \ldots, \frac{(q_{kM}+1)}{2}\right]^T. \quad (19)$$

The present disclosure describes two different methods of implementing the qDiff-LMS. The first method is a Combine-Then-Adapt (CTA) based qDiff-LMS method and the second method is an Adapt-Then-Combine (ATC) based qDiff-LMS method.

In the CTA based qDiff-LMS method, the previous time instant weights from all neighboring nodes are first combined using the linear combination given in equation (8). Further, the global weights are updated using equation (18). Accordingly, the CTA based qDiff-LMS can be summarized as:

$$\emptyset_k(i-1) = \sum_{l \in N_k} c_{kl} w_l(i-1), \quad \text{Combinding step} \quad (20)$$

$$w_k(i) = \emptyset_k(i-1) + \mu G_k x_k^T(i)(d_k(i) - x_k(i)\emptyset_k(i-1)), \quad \text{Adaptation Step}$$

In the ATC based qDiff-LMS method, initially adaptation of $\emptyset_k(i-1)$ is obtained using gradient of $w_l(i-1)$. Thereafter, the weights of all neighboring nodes $\{\emptyset_k(i-1)\}$ are combined in a the linear combination. Accordingly, the ATC based qDiff-LMS can be summarized as:

$$\begin{cases} \emptyset_k(i-1) = w_k(i-1) + \mu G_k x_k^T(i)(d_k(i) - x_k(i)w_k(i-1)), & \text{Adapt. step} \\ w_k(i-1) = \sum_{l \in N_k} c_{kl} \emptyset_l(i-1), & \text{Comb. step} \end{cases} \quad (21)$$

The combining coefficients, $c_{kl}$, used in the CTA based qDiff-LMS and ATC based qDiff-LMS are equally distributed (as provided by equation (9)) and are generally chosen to enhance the overall cooperation among neighboring nodes such that it is a convex-combination, i.e., $$\sum_{l \in N_k} c_{kl} = 1. \quad (22)$$

The present disclosure also determines a time-varying q-parameter for the proposed CTA based qDiff-LMS and ATC based qDiff-LMS methods as the q-parameter can affect the convergence speed and the final steady-state mean square error (MSE). In an example, a larger value of the q-parameter may result in faster convergence at the cost of lower steady-state MSE, and a smaller value of the q-parameter may result in slower convergence but with a smaller steady-state MSE. Thus, the objective of the present disclosure is that the q parameter should attain larger value in the initial phase of adaptation and later reduces to smaller value near steady-state. As a result, this leads to faster convergence and a lower steady-state MSE value. The approach is summarized in equation (23), provided below:

$$\zeta_k(i+1) = B\zeta_k(i) + \gamma e_k^2(i), \quad (0 < \beta < 1, \gamma > 0), \quad (23)$$

$$\text{with } q_k(i+1) = \begin{cases} q_k^{up} & \text{if } \zeta_k(i+1) > q_k^{up} \\ 1 & \text{if } \zeta_k(i+1) < 1 \\ \zeta_k(i+1) & \text{otherwise} \end{cases}$$

where, $\beta$ is a first constant tuning parameter, and $\gamma$ is a second constant tuning parameter, and $q_k^{up}$ is chosen to satisfy the stability bound, i.e., $$q_k^{up} = \frac{2}{\mu \lambda_{max}^k}. \quad (24)$$

where, $\lambda_{max}^k$ is a maximum eigenvalue of an input correlation matrix for node k, i.e., $E[x_k x_k^T]$.

The above equations (23) and (24) facilitate in providing an automatic adjustment of $q_k(i)$ according to the estimation of the square of the estimation error. In an example, when the estimate is a large value, $q_k(i)$ will approach its upper bound denoted by $q_k^{up}$, thus providing fast adaptation while its smaller value will make $q_k(i)$ close to unity for a lower steady-state error. This provides both a faster convergence and a lower steady-state error for the qDiff-LMS method. Accordingly, with the inclusion of the time varying q-parameter, the adaptation steps of the CTA based qDiff-LMS and ATC based qDiff-LMS methods (as provided by equations (20) and (21)) will be governed by the time varying $G_k$ matrix. Accordingly, the $G_k$ matrix appearing in equations (20) and (21) will be replaced by its time varying version denoted as $G_k(i)$.

The CTA based qDiff-LMS and ATC based qDiff-LMS methods of the present disclosure are described in detail in the following.

A) CTA Based q-Diffusion LMS

According to an aspect of the present disclosure, the computing device 120 is configured to receive, at each node, k, a local estimate of a previous time instance weight of an adaptive filter 130 of each neighboring node, l, where l=1, 2, . . . , M. Upon receiving the local estimates of the previous time instance weights, the computing device 120 is configured to combine the local estimates of the previous time instance weights to generate a linear combination global diffused weights, $\emptyset_k(i-1)$. The linear combination of global diffused weights, $\emptyset_k(i-1)$ is generated based on the equation (8).

The computing device 120 is further configured to calculate an output, $y_k(i)$, of the adaptive filter 130 at each node k based on:

$$y_k(i) = x_k(i)\emptyset_k(i-1); \quad (25)$$

where $x_k(i)$ is an input signal vector of size 1×M at the node k.

Further, the computing device 120 is configured to calculate, for each node k, a desired response, $d_k(i)$. Subsequently, the computing device 120 is configured to calculate an estimation error, $e_k^{CTA}(i)$, for each node k by subtracting the output, $y_k(i)$ from the desired response, $d_k(i)$. The estimation error, $e_k^{ATC}(i)$ is generated based on equation (26), provided below:

$$e_k^{CTA}(i)=d_k(i)-y_k(i)=d_k(i)-x_k(i)\emptyset_k(i-1) \qquad (26)$$

The computing device 120 is configured to update each previous time instance weight of each adaptive filter 130 of the linear combination of the global diffused weights, $\emptyset_k(i-1)$. In an example, the computing device 120 may be configured to update the global diffused weights by adding a portion of the estimated error to the global diffused weights.

Further, the computing device 120 is configured to apply a steepest descent optimization of a q-LMS to update each previous time instance weight, $w_k(i-1)$, of the linear combination of the global diffused weights, $\emptyset_k(i-1)$, to an updated weight $w(i)$, such that each updated weight $w_k(i)$ is given by equation (27), provided below:

$$w_k(i)=\emptyset_k(i-1)+\mu G_k x_k^T(i) e_k^{CTA}(i). \qquad (27)$$

where $\mu$ is a fixed step-size of the steepest descent optimization, $x_k^T(i)$ represents a transpose of $x_k(i)$, and $G_k$ is a diagonal matrix having q-parameters on a diagonal, and where the diagonal is given by equation (16).

The computing device 120 is configured to modify the matrix $G_k$ by a time varying q-parameter $G_k(i)$, where each eigenvalue, $\zeta_k(i+1)$, of matrix $G_k(i)$ is calculated based on equation (28), provided below.

$$\zeta_k(i+1)=\beta\zeta_k(i)+\gamma|e_k^{CTA}|^2, (0<\beta<1,\gamma>0), \qquad (28)$$

Further, the computing device 120 may be configured to form a weight matrix of the global diffused weights by selecting each q-parameter based on equation (23).

B) ATC Based q-Diffusion LMS

According to an aspect of the present disclosure, the computing device 120 is configured to calculate an output, $y_k(i)$, of an adaptive filter 130 of each node k, based on a product of a measured position, $x_k(i)$ of the node k, and an estimate of a previous time instance weight, $w_k(i-1)$ of each adaptive filter 130. The computing device 120 calculates the output, $y_k(i)$, of the adaptive filter 130 of each node k using equation (29), provided below:

$$C) y_k(i)=x_k(i)w_k(i-1). \qquad (29)$$

Further, the computing device 120 is configured to calculate, for each node, k, a desired response, $d_k(i)$. The computing device 120 is configured to calculate, for each node k, an estimation error, $e_k^{ATC}(i)$ by subtracting the output, $y_k(i)$ from the desired response, $d_k(i)$. The computing device 120 may calculate the estimation error, $e_k^{ATC}(i)$ based on equation (30), provided below:

$$e_k^{ATC}(i)=d_k(i)-y_k(i)=d_k(i)-x_k(i)w_k(i-1). \qquad (30)$$

The computing device 120 is configured to update the local estimate of the previous time instance weight, $w_k(i-1)$, of the adaptive filter 130 at each node k by adding a portion of the estimation error to the previous time instance weight, thus generating a local estimate of a diffused weight, $\emptyset_k(i-1)$. Further, the computing device 120 may apply a steepest descent optimization of a q-LMS to update each local estimate of the diffused weight $\emptyset_k(i-1)$ based on equation (31), provided below:

$$\emptyset_k(i-1)=w_k(i-1)+\mu G_k x_k^T(i) e_k^{ATC}(i). \qquad (31)$$

where $\mu$ is a fixed step-size of the steepest descent optimization, $x_k^T(i)$ represents a transpose of $x_k(i)$, and $G_k$ is a diagonal matrix having q-parameters on a diagonal, and where the diagonal is given by equation (19).

Further, the computing device 120 is configured to modify the matrix $G_k$ by the time varying q-parameter $G_k(i)$, wherein each diagonal, $\zeta_k(i+1)$, of matrix $G_k(i)$ is calculated based on:

$$\zeta_k(i+1)=\beta\zeta_k(i)+\gamma|e_k^{ATC}(i)|^2, \text{ where } (0<\beta<1,\gamma>0), \qquad (32)$$

The computing device 120 may form a weight matrix of the global diffused weights by selecting each q-parameter based on:

$$q_k(i+1) = \begin{cases} q_k^{up} & \text{if } \zeta_k(i+1) > q_k^{up} \\ 1 & \text{if } \zeta_k(i+1) < 1 \\ \zeta_k(i+1) & \text{otherwise} \end{cases} \qquad (33)$$

Also, the computing device 120 may receive, at each node k, the local estimate of the diffused weight $\emptyset_l(i-1)$, from each neighboring node l, where l=1, 2, . . . , M and combine the local estimates of the diffused weights $\emptyset_k(i-1)$ in a linear combination to generate a linear combination of global diffused weights, w.

The computing device 120 may generate the global diffused weight, w, based on equation (34), provided below.

$$w = \sum_{l \in N_k} c_{kl} \emptyset_l(i-1) \qquad (34)$$

FIG. 1B illustrates a computing device 120 of the system that performs distributed estimation using qDiff-LMS, according to aspects of the present disclosure. In an aspect of the present disclosure, each node k of the N nodes of the decentralized wireless sensor network 102 includes the computing device 120. The computing device 120 is configured to perform distributed estimation using qDiff-LMS to modify adaptive filter weights in the decentralized wireless sensor network 102 of N nodes. As shown in FIG. 1B, the computing device 120 includes a communication device 166, a controller 174, an adaptive filter 130, a processor 176, a memory 182, an estimation unit 106, a generation unit 110, an updating unit 196, other processors 126, an I/O device 186, a keyboard 188, a printer 190, a display 192, and a communication bus 175.

The communication device 166 receives adaptive filter weights from the N nodes at antenna 160. The controller 174 may be configured to control the transfer of data from the computing device 120 to one or more peripheral devices (such as the I/O device 186, the keyboard 188, the printer 190, and the display 192) and vice versa.

The computing device 120 may include program instructions which may be executed by the processor 176 and other processors 126. In an example, the processor 176 may perform distributed estimation using qDiff-LMS. The process data and instructions may be stored in the memory 182. The processor 176 may respond to and process instructions fetched from the memory 182. The processor 176 may communicate with the memory 182 via the communication bus 175.

The estimation unit 106, the generation unit 110, and the updating unit 196 may be applications or programs communicatively coupled to the processor 176 and the memory 182. The estimation unit 106, the generation unit 110, and the updating unit 196, amongst other units, may include routines, programs, objects, components, data structures, etc., which may perform particular tasks or implement particular abstract data types. In an example, the estimation unit 106 may be configured to calculate an output, $y_k(i)$, of the adaptive filter 130 of the node k, based on a product of a measured position, $x_k(i)$ of the node k, and an estimate of a previous time instance weight, $w_k(i-1)$ of each adaptive filter 130. Further, the estimation unit 106 may be configured to calculate, for each node k, a desired response, $d_k(i)$. The generation unit 110 may be configured to generate, for each node k, an estimation error, $e_k(i)$, by subtracting the output, $y_k(i)$ from the desired response, $d_k(i)$. Further, the generation unit 110 may be configured to generate one of a linear combination global diffused weights, $\emptyset_k(i-1)$ based on receiving, at each node k, a local estimate of a previous time instance weight, $w_k(i-1)$, of an adaptive filter 130 of each neighboring node, l, where l=1, 2, . . . , M, and a linear combination of global diffused weights, $\emptyset_k(i-1)$ based on receiving, at each node k, a local estimate of the diffused weight $\emptyset_l(i-1)$ calculated by each neighboring node l. The updating unit 196 may be configured to update one or more of the previous time instance weights, $w_k(i-1)$ of each adaptive filter 130, and the local estimate of the diffused weights $\emptyset_l(i-1)$.

An operator of the system of FIG. 1 may use the I/O device 186 and/or the keyboard 188 to input data into the computing device 120. In an example, the operator may input commands through the I/O device 186 to obtain measurements associated with the distributed estimation and to obtain plots associated with measurements. The operator may view the measurements, plots, reports, etc., on the display 192, and print the measurements or reports through the printer 190.

The following examples are provided to illustrate further and to facilitate the understanding of the present disclosure.

The performance analysis of the qDiff-LMS method was investigated in a system identification scenario where the objective is to estimate an unknown system having impulse response $w^o=[0.227, 0.460, 0.688, 0.460, 00.227]^T$. The system noise is a zero mean independent and identically distributed (i.i.d) sequence with variance 0.05 which corresponds to 13 dB SNR. In an example, throughout the simulation, the adaptive filter 130 used has same length as that of the unknown system which is equal to 5. For the performance measurement, the mean-square-deviation (MSD) is evaluated per node, which is the average MSD of all the nodes, N. The average MSD of all the nodes is given by equation (35), provided below:

$$MSD(i) \triangleq \frac{1}{N}\sum_{k=1}^{N} \|w^o - w_k(i)\|^2. \tag{35}$$

Figure 2:
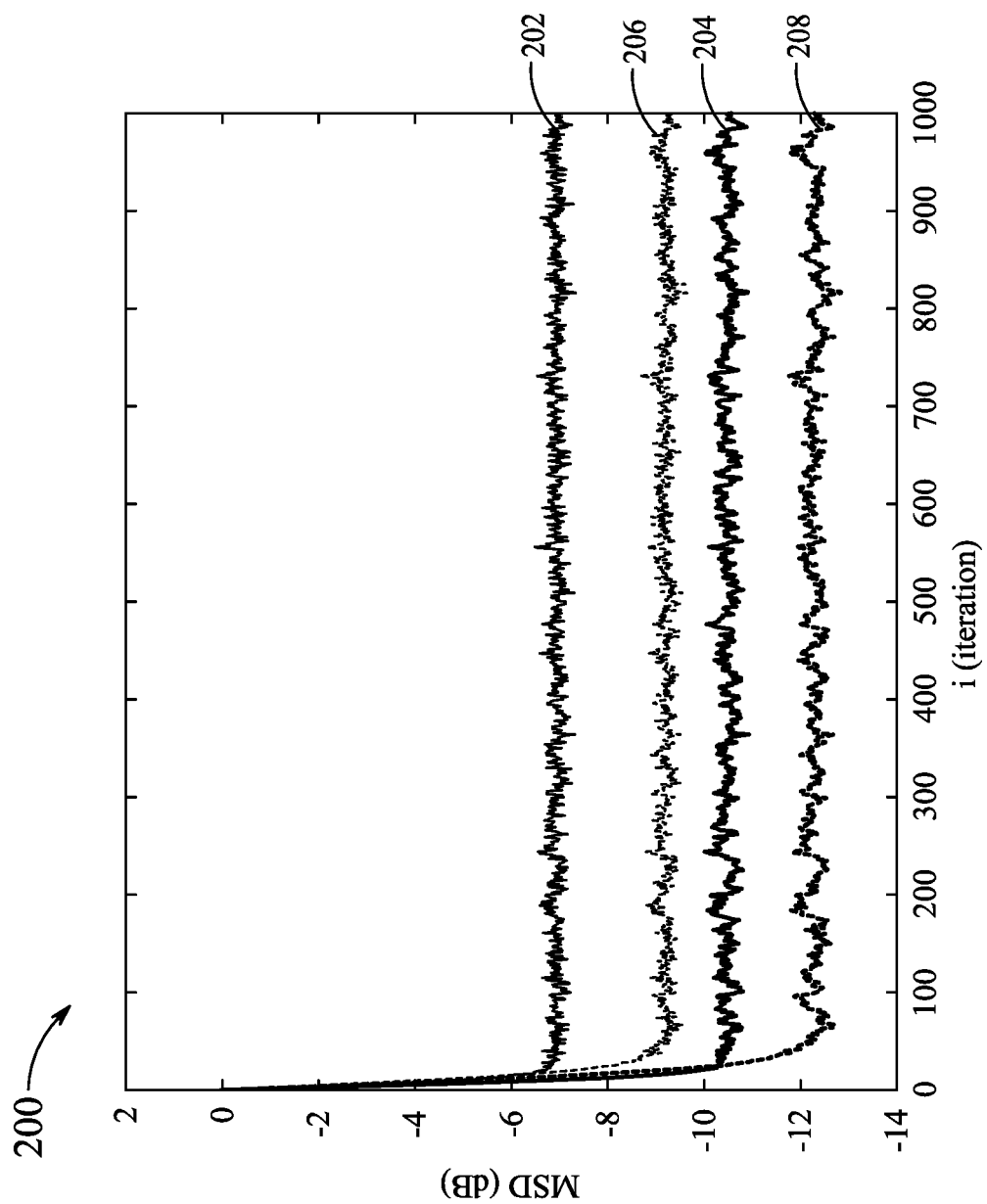
FIG. 2 depicts a plot illustrating performance comparison for a mean-square-deviation (MSD) between fixed q parameter based adapt-then-combine (ATC) qDiff-LMS, fixed q parameter based combine-then-adapt (CTA) qDiff-LMS, conventional ATC based Diff-LMS, and conventional CTA based Diff-LMS for Gaussian noise, according to aspects of the present disclosure.

A performance comparison for MSD was carried out between the fixed q parameter based ATC qDiff-LMS method of the present disclosure, the fixed q parameter based CTA qDiff-LMS method of the present disclosure the conventional ATC based Diff-LMS, and the conventional CTA based Diff-LMS for three different noise environments: Gaussian noise, uniform noise, and binary noise. The step size for each method is set to 2. Further, the simulation results are obtained by averaging the 100 independent trials for each experiment. The fixed value of the q parameters is manually tuned that gives q=[0.8176 0.8769 0.5319 0.6738 0.3697]. A plot 200 illustrating the performance comparison for MSD between the fixed q parameter based ATC qDiff-LMS, the fixed q parameter based CTA qDiff-LMS, the conventional ATC based Diff-LMS, and the conventional CTA based Diff-LMS for Gaussian noise is depicted in FIG. 2. Plot line 202 illustrates the performance of the conventional CTA based Diff-LMS, plot line 204 illustrates the performance of the conventional ATC based Diff-LMS, plot line 206 illustrates the performance of the fixed q parameter based CTA qDiff-LMS method of the present disclosure, and plot line 208 illustrates the performance of the fixed q parameter based ATC qDiff-LMS method of the present disclosure.

As shown in FIG. 2, the ATC qDiff-LMS and CTA qDiff-LMS methods described by the present disclosure have lower MSD in comparison to the conventional ATC based Diff-LMS and the conventional CTA based Diff-LMS. As shown in FIG. 2, both the ATC qDiff-LMS and CTA qDiff-LMS methods of the present disclosure have 3 dB lower steady-state MSD in comparison to the conventional ATC based Diff-LMS and the conventional CTA based Diff-LMS methods. Also, as can be seen in FIG. 2, performance of the ATC based methods is greater than for the CTA based methods.

Figure 3:
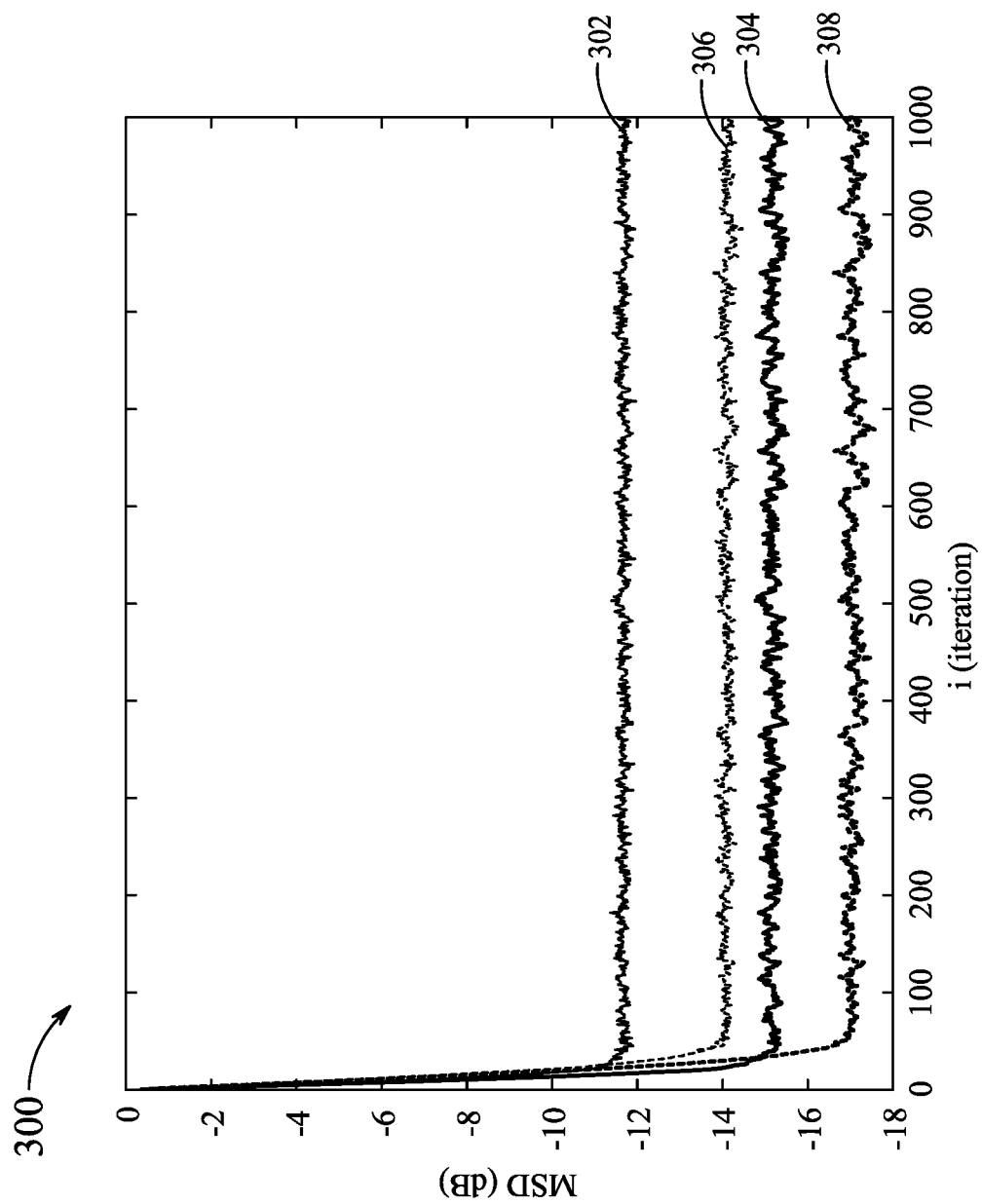
FIG. 3 depicts a plot illustrating performance comparison for an MSD between the fixed q parameter based ATC qDiff-LMS, the fixed q parameter based CTA qDiff-LMS, the conventional ATC based Diff-LMS, and the conventional CTA based Diff-LMS for uniform noise, according to aspects of the present disclosure.

A plot 300 illustrating the performance comparison for MSD between the fixed q parameter based ATC qDiff-LMS method of the present disclosure, the fixed q parameter based CTA qDiff-LMS method of the present disclosure, the conventional ATC based Diff-LMS, and the conventional CTA based Diff-LMS for uniform noise is depicted in FIG. 3. Plot line 302 illustrates the performance of the conventional CTA based Diff-LMS, plot line 304 illustrates the performance of the conventional ATC based Diff-LMS, plot line 306 illustrates the performance of the fixed q parameter based CTA qDiff-LMS of the present disclosure, and plot line 308 illustrates the performance of the fixed q parameter based ATC qDiff-LMS of the present disclosure. As illustrated in FIG. 3, the ATC qDiff-LMS and CTA qDiff-LMS of the present disclosure have lower MSD (i.e., approximately 3 dB lower MSD values) in comparison to the conventional ATC based Diff-LMS and the conventional CTA based Diff-LMS.

Figure 4:
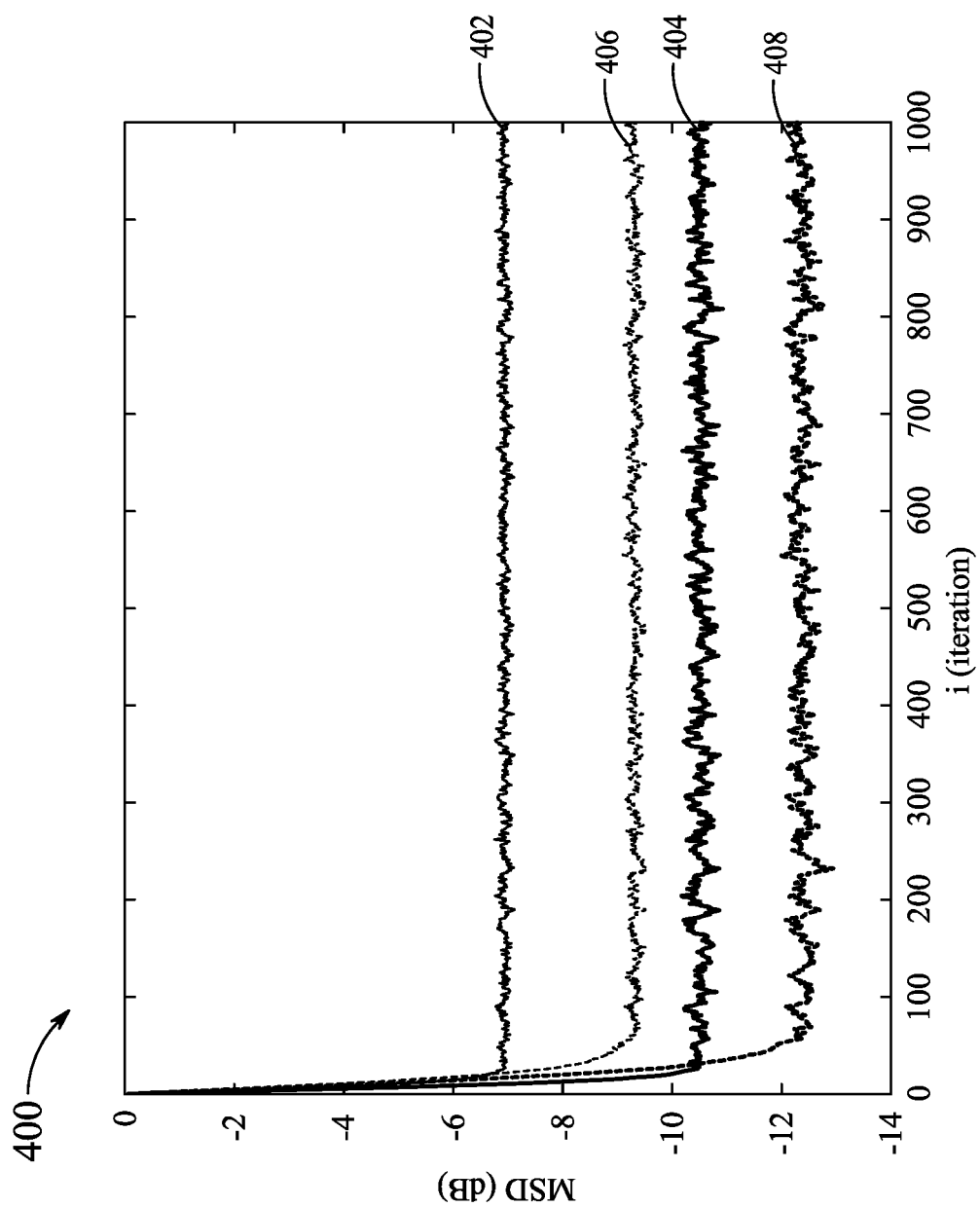
FIG. 4 depicts a plot illustrating performance comparison for an MSD between the fixed q parameter based ATC qDiff-LMS, the fixed q parameter based CTA qDiff-LMS, the conventional ATC based Diff-LMS, and the conventional CTA based Diff-LMS for binary noise, according to aspects of the present disclosure.

A plot 400 illustrating the performance comparison for MSD between the fixed q parameter based ATC qDiff-LMS method of the present disclosure, the fixed q parameter based CTA qDiff-LMS method of the present disclosure, the conventional ATC based Diff-LMS, and the conventional CTA based Diff-LMS for binary noise is depicted in FIG. 4. Plot line 402 illustrates the performance of the conventional CTA based Diff-LMS, plot line 404 illustrates the performance of the conventional ATC based Diff-LMS, plot line 406 illustrates the performance of the fixed q parameter based CTA qDiff-LMS of the present disclosure, and plot line 408 illustrates the performance of the fixed q parameter based ATC qDiff-LMS of the present disclosure. As illustrated in FIG. 4, the proposed ATC qDiff-LMS and CTA qDiff-LMS of the present disclosure have lower MSD (i.e., approximately 3 dB lower MSD values) in comparison to the conventional ATC based Diff-LMS and the conventional CTA based Diff-LMS.

Further, a performance comparison for MSD has been carried out between the time varying q parameter based ATC qDiff-LMS method of the present disclosure, the time varying q parameter based CTA qDiff-LMS method of the present disclosure, the conventional ATC based Diff-LMS, and the conventional CTA based Diff-LMS for three different noise environments: Gaussian noise, uniform noise, and binary noise. The step size of all the compared methods is set to 2. Further, the simulation results are obtained by averaging the 100 independent trials for each experiment. The time varying value of the q parameters are calculated using the equation (23).

Figure 5:
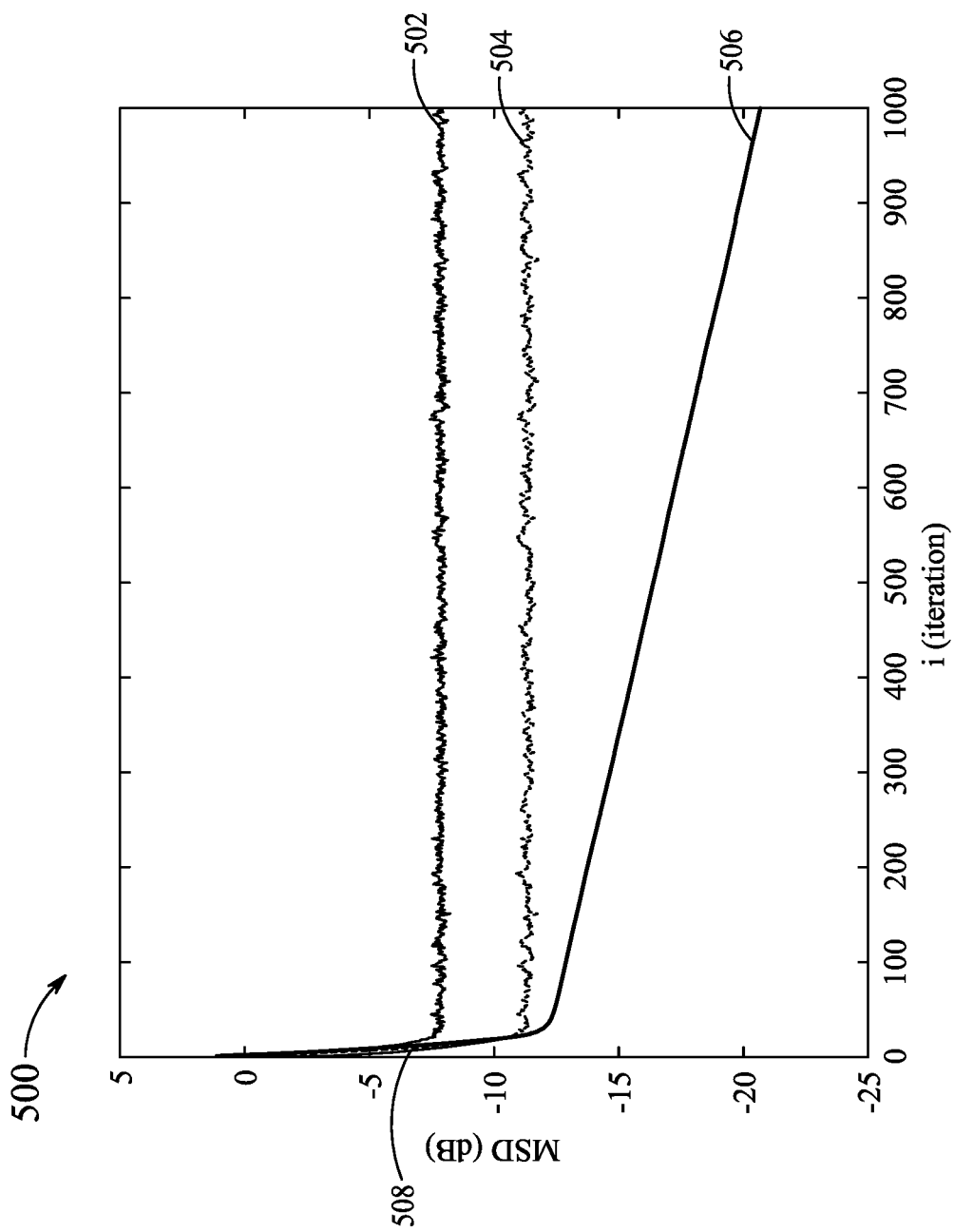
FIG. 5 illustrates performance comparison for an MSD between the time varying q parameter based ATC qDiff-LMS, the time varying q parameter based CTA qDiff-LMS, the conventional ATC based Diff-LMS, and the conventional CTA based Diff-LMS for Gaussian noise, according to aspects of the present disclosure.

A plot 500 illustrating the performance comparison for MSD between the time varying q parameter based ATC qDiff-LMS method of the present disclosure, the time varying q parameter based CTA qDiff-LMS method of the present disclosure, the conventional ATC based Diff-LMS, and the conventional CTA based Diff-LMS for Gaussian noise is depicted in FIG. 5. Plot line 502 illustrates the performance of the conventional CTA based Diff-LMS, plot line 504 illustrates the performance of the conventional ATC based Diff-LMS, plot line 506 illustrates the performance of the time varying q parameter based CTA qDiff-LMS of the present disclosure, and plot line 508 illustrates the performance of the time varying q parameter based ATC qDiff-LMS of the present disclosure.

As shown in FIG. 5, the ATC qDiff-LMS and CTA qDiff-LMS of the present disclosure have lower MSD in comparison to the conventional ATC based Diff-LMS and the conventional CTA based Diff-LMS. As shown in FIG. 5, both the ATC qDiff-LMS and CTA qDiff-LMS of the present disclosure have 10 to 15 dB lower steady-state MSD in comparison to the conventional ATC based Diff-LMS and the conventional CTA based Diff-LMS.

Figure 6:
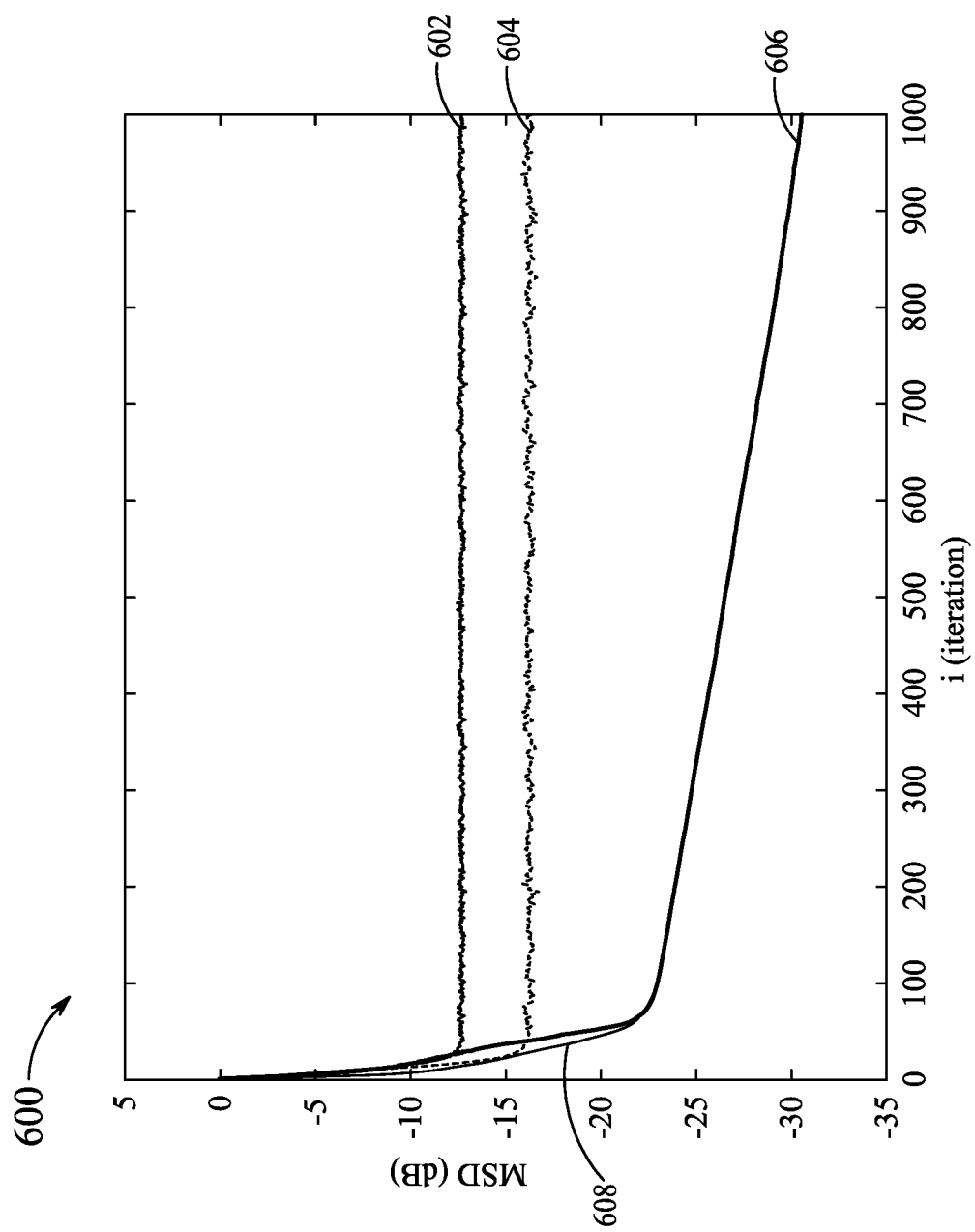
FIG. 6 illustrates performance comparison for an MSD between the time varying q parameter based ATC qDiff-LMS, the time varying q parameter based CTA qDiff-LMS, the conventional ATC based Diff-LMS, and the conventional CTA based Diff-LMS for uniform noise, according to aspects of the present disclosure.

A plot 600 illustrating the performance comparison for MSD between the time varying q parameter based ATC qDiff-LMS of the present disclosure, the time varying q parameter based CTA qDiff-LMS of the present disclosure, the conventional ATC based Diff-LMS, and the conventional CTA based Diff-LMS for uniform noise is depicted in FIG. 6. Plot line 602 illustrates the performance of the conventional CTA based Diff-LMS, plot line 604 illustrates the performance of the conventional ATC based Diff-LMS, plot line 606 illustrates the performance of the time varying q parameter based CTA qDiff-LMS of the present disclosure, and plot line 608 illustrates the performance of the time varying q parameter based ATC qDiff-LMS of the present disclosure.

As shown in FIG. 6, the ATC qDiff-LMS and CTA qDiff-LMS of the present disclosure have lower MSD in comparison to the conventional ATC based Diff-LMS and the conventional CTA based Diff-LMS. Both the ATC qDiff-LMS and CTA qDiff-LMS of the present disclosure have 10 to 15 dB lower steady-state MSD in comparison to the conventional ATC based Diff-LMS and the conventional CTA based Diff-LMS.

Figure 7:
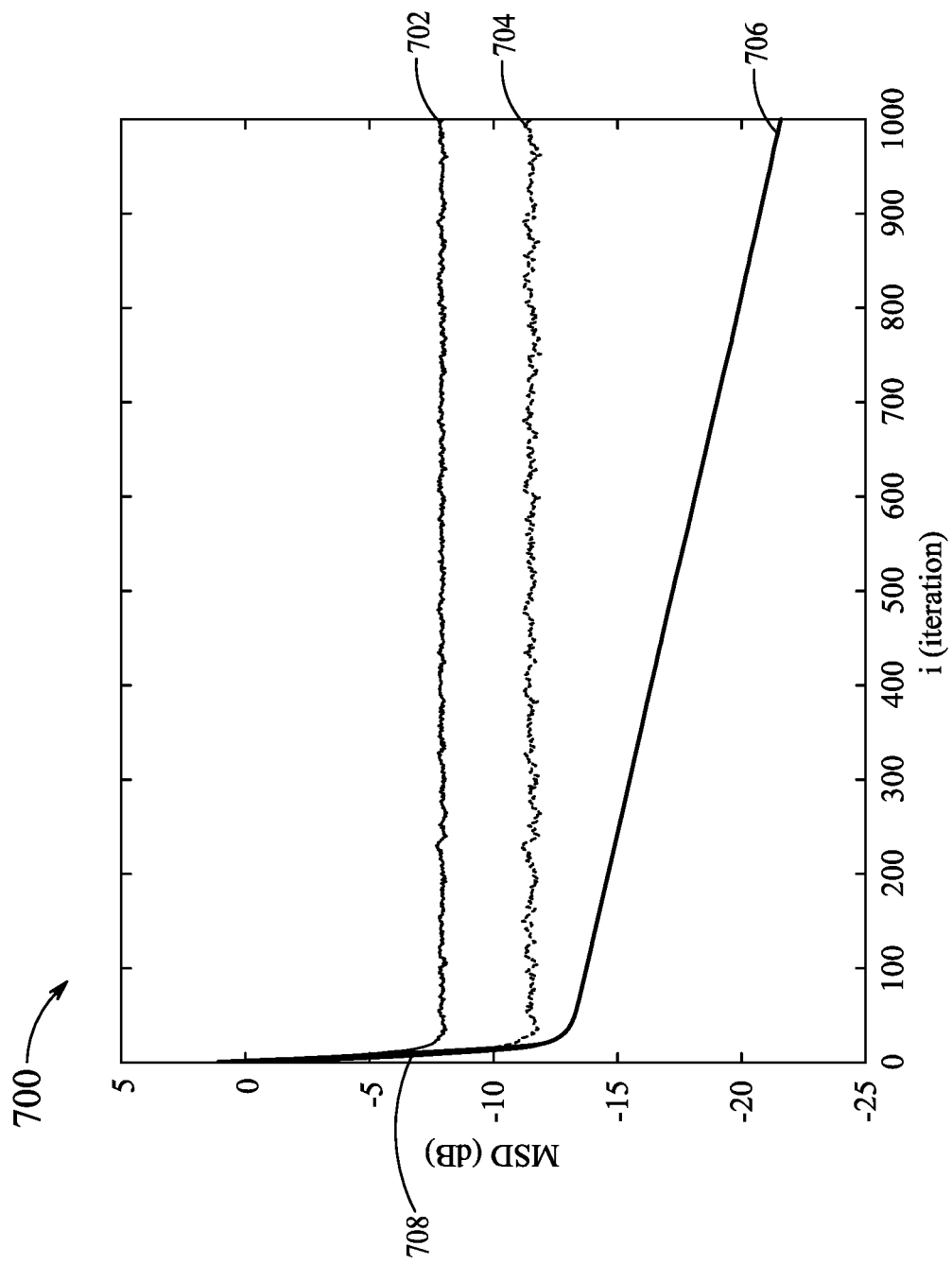
FIG. 7 illustrates performance comparison for an MSD between the time varying q parameter based ATC qDiff-LMS, the time varying q parameter based CTA qDiff-LMS, the conventional ATC based Diff-LMS, and the conventional CTA based Diff-LMS for binary noise, according to aspects of the present disclosure.

A plot 700 illustrating the performance comparison for MSD between the time varying q parameter based ATC qDiff-LMS of the present disclosure, the time varying q parameter based CTA qDiff-LMS of the present disclosure, the conventional ATC based Diff-LMS, and the conventional CTA based Diff-LMS for binary noise is depicted in FIG. 7. Plot line 702 illustrates the performance of the conventional CTA based Diff-LMS, plot line 704 illustrates the performance of the conventional ATC based Diff-LMS, plot line 706 illustrates the performance of the time varying q parameter based CTA qDiff-LMS of the present disclosure, and plot line 708 illustrates the performance of the time varying q parameter based ATC qDiff-LMS of the present disclosure.

As shown in FIG. 7, the proposed ATC qDiff-LMS and CTA qDiff-LMS have lower MSD in comparison to the conventional ATC based Diff-LMS and the conventional CTA based Diff-LMS. As shown in FIG. 7, both the ATC qDiff-LMS and CTA qDiff-LMS methods of the present disclosure have 10 to 15 dB lower steady-state MSD in comparison to the conventional ATC based Diff-LMS and the conventional CTA based Diff-LMS.

The present disclosure describes a modified D-LMS with improved convergence performance by employing q-calculus. Further, a weight update mechanism is derived by minimizing the conventional MSE cost function by using q-derivative in a distributed estimation environment, which results in the qDiff-LMS. This design has the advantage of fast convergence as the q-derivative seeks to find optimal solution with larger gradient steps. Thus, this improves the convergence speed in contrast to the conventional diffusion LMS.

The present disclosure also describes an intelligent design for a time-varying q parameter with the aim of achieving both faster convergence and lower-steady state error. This is achieved by varying the q parameter according to the energy of the estimation error. The value of q parameter attains larger value in the initial state of adaptation, thus giving faster convergence and acquiring a smaller value near steady-state, resulting in a lower-steady state error. This facilitates implementation of the qDiff-LMS in real time applications. The qDiff-LMS is tested for distributed estimation with both fixed and time-varying q parameters. As described above, qDiff-LMS of the present disclosure is superior in terms of both convergence speed and steady-state MSD in comparison to conventional diffusion LMS.

Figure 8:
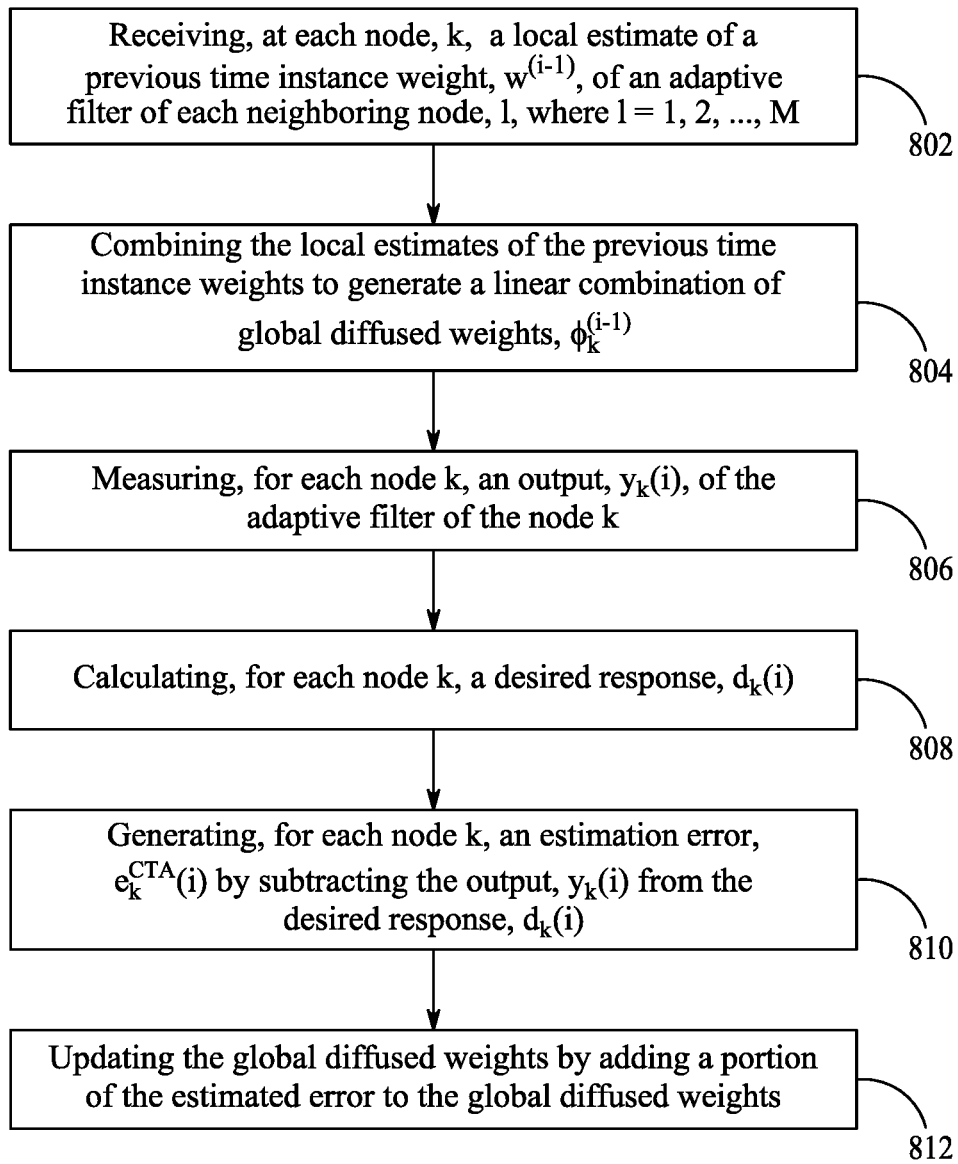
FIG. 8 illustrates a method of distributed estimation performed by the computing device using qDiff-LMS to modify adaptive filter weights in the decentralized wireless sensor network of N nodes, according to aspects of the present disclosure.

FIG. 8 illustrates a method 800 of distributed estimation performed by the computing device 120 using qDiff-LMS to modify adaptive filter 130 weights in the decentralized wireless sensor network 102 of N nodes, according to aspects of the present disclosure;

At step 802, the method 800 includes receiving, at each node, k, a local estimate of a previous time instance weight, $w_k(i-1)$, of an adaptive filter 130 of each neighboring node, l, where l=1, 2, ..., M.

At step 804, the method 800 includes combining the local estimates of the previous time instance weights to generate a linear combination of global diffused weights, $\emptyset_k(i-1)$. In an example, the computing device 120 generates the linear combination of global diffused weights, $\emptyset_k(i-1)$ based on equation (8).

At step 806, the method 800 includes measuring, for each node k, an output, $y_k(i)$, of the adaptive filter 130 of the node k. In an example, the computing device 120 measures or calculates the output, $y_k(i)$, based on equation (25).

At step 808, the method 800 includes calculating, for each node k, a desired response, $d_k(i)$.

At step 810, the method 800 includes generating, for each node k, an estimation error, $e_k^{CTA}(i)$ by subtracting the output, $y_k(i)$ from the desired response, $d_k(i)$. In an example, the computing device 120 calculates the estimation error, $e_k^{CTA}(i)$ using equation (26).

At step 812, the method 800 includes updating the global diffused weights by adding a portion of the estimated error to the global diffused weights. In an example, the computing device 120 applies a steepest descent optimization of a q-LMS to update each previous time instance weight, $w_k(i-1)$, of the linear combination of the global diffused weights, $\emptyset_k(i-1)$, to an updated weight $w_k(i)$, such that each updated weight $w_k(i)$ is given by the equation (27).

Figure 9:
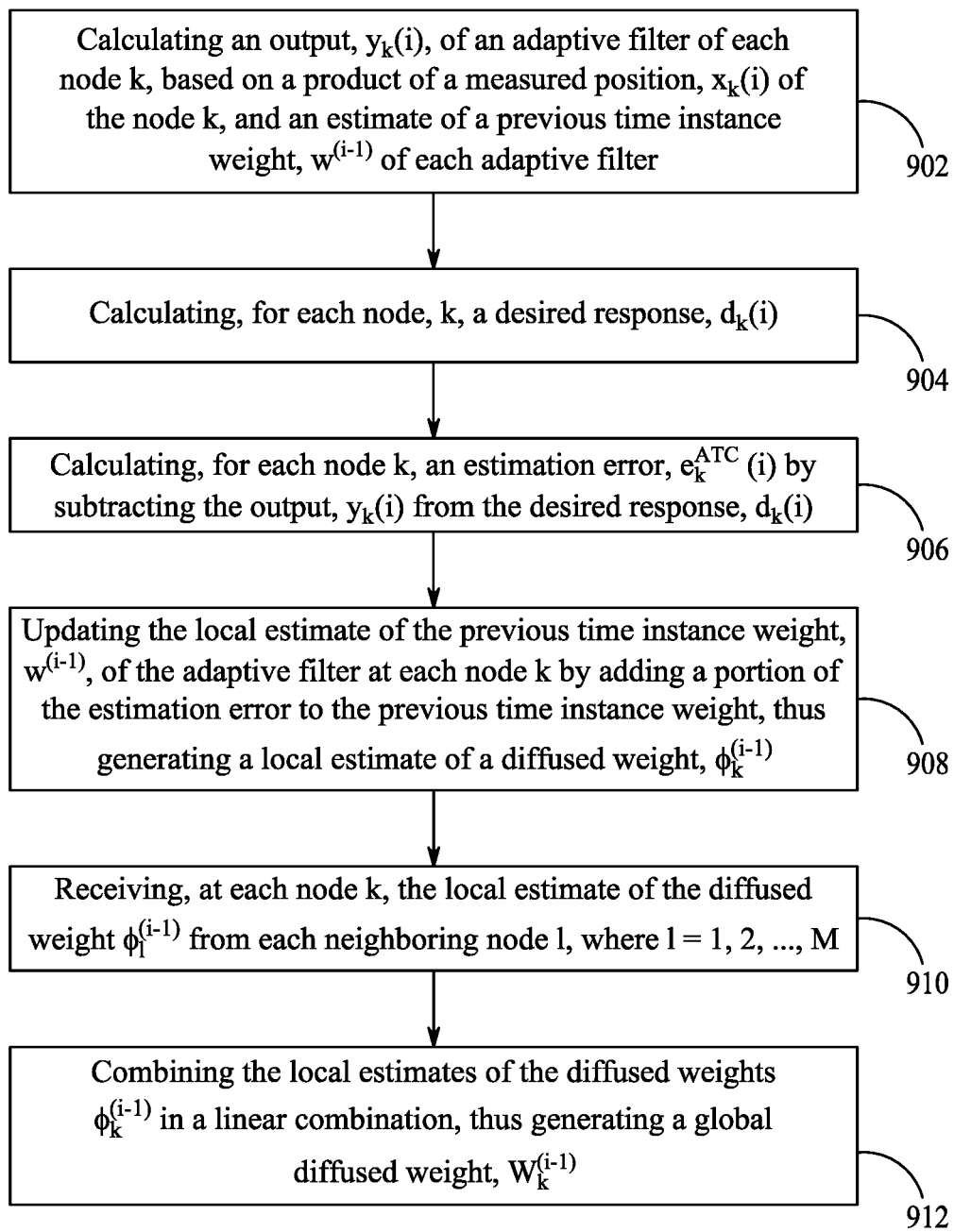
FIG. 9 illustrates another method of distributed estimation performed by the computing device using qDiff-LMS to modify adaptive filter weights in the decentralized wireless sensor network of N nodes, according to aspects of the present disclosure.

FIG. 9 illustrates another method 900 of distributed estimation performed by the computing device 120 using qDiff-LMS to modify adaptive filter 130 weights in the decentralized wireless sensor network 102 of N nodes, according to aspects of the present disclosure.

At step 902, the method 900 includes calculating an output, $y_k(i)$, of an adaptive filter 130 of each node k, based on a product of a measured position, $x_k(i)$ of the node k, and an estimate of a previous time instance weight, $w_k(i-1)$ of each adaptive filter 130. In an example, the computing device 120 calculates the output, $y_k(i)$, using the equation (29).

At step 904, the method 900 includes calculating, for each node, k, a desired response, $d_k(i)$.

At step 906, the method 900 includes calculating, for each node k, an estimation error, $e_k^{ATC}(i)$ by subtracting the output, $y_k(i)$ from the desired response, $d_k(i)$. In an example, the computing device 120 calculates the estimation error, $e_k^{ATC}(i)$ using equation (30).

At step 908, the method 900 includes updating the local estimate of the previous time instance weight, $w_k(i-1)$, of the adaptive filter 130 at each node k by adding a portion of the estimation error to the previous time instance weight, thus generating a local estimate of a diffused weight, $\emptyset_k(i-1)$. In an example, the computing device 120 calculates the local estimate of the diffused weight, $\emptyset_k(i-1)$ using equation (31).

At step 910, the method 900 includes receiving, at each node k, the local estimate of the diffused weight $\emptyset(i-1)$ from each neighboring node l, where l=1, 2, . . . , M.

At step 912, the method 900 includes combining the local estimates of the diffused weights $\emptyset_k(i-1)$ in a linear combination, thus generating a global diffused weight, $w_k(i-1)$. The computing device 120 generates the global diffused weight, w based on equation (34).

The first embodiment is illustrated with respect to FIGS. 1-9. The first embodiment describes a method of distributed estimation, performed by a computing device 120, using qDiff-LMS to modify adaptive filter 130 weights in a decentralized wireless sensor network 102 of N nodes. The method comprises receiving, at each node, k, a local estimate of a previous time instance weight, $w_k(i-1)$, of an adaptive filter 130 of each neighboring node, l, where l=1, 2, . . . , M, combining the local estimates of the previous time instance weights to generate a linear combination of global diffused weights, $\emptyset_k(i-1)$, measuring, for each node k, an output, $y_k(i)$, of the adaptive filter 130 of the node k, calculating, for each node k, a desired response, $d_k(i)$, generating, for each node k, an estimation error, $e_k^{CTA}(i)$ by subtracting the output, $y_k(i)$ from the desired response, $d_k(i)$, and updating the global diffused weights by adding a portion of the estimated error to the global diffused weights.

The method further comprises generating the linear combination of global diffused weights, $\emptyset_k(i-1)$, based on:

$$\emptyset_k(i-1) = \sum_{l \in N_k} c_{kl} w_l(i-1),$$

where $c_{kl}$ is a combining coefficient equal to $1/N_k$, for each node k, where $N_k$ is a sum of the nodes in the neighborhood of the node k.

The method further comprises calculating the output $y_k(i)$ of the adaptive filter 130 at each node k based on:

$$y_k(i) = x_k(i)\emptyset_k(i-1)$$

where $x_k(i)$ is an input signal vector of size 1×M at the node k.

The method further comprises applying a steepest descent optimization of a q-LMS algorithm to update each previous time instance weight, $w_k(i-1)$, of the linear combination of the global diffused weights, $\emptyset_k(i-1)$, to an updated weight $w_k(i)$, such that each updated weight $w_k(i)$ is given by:

$$w_k(i) = \emptyset_k(i-1) + \mu G_k x_k^T(i) e_k^{CTA}(i)$$

where μ is a fixed step size of the steepest descent optimization, T represents a transpose of $x_k(i)$, and $G_k$ is a diagonal matrix having q-parameters on a diagonal, where the diagonal is given by:

$$\text{diag}(G_k) = \left[\frac{(q_{k1}+1)}{2}, \frac{(q_{k2}+1)}{2}, \ldots, \frac{(q_{kM}+1)}{2}\right]^T.$$

The method further comprises modifying the matrix $G_k$ by a time varying q-parameter $G_k(i)$, wherein each eigenvalue, $\zeta_k(i+1)$, of matrix $G_k(i)$ is calculated based on:

$$\zeta_k(i+1) = \beta \zeta_k(i) + \gamma e_k^2(i), (0 < \beta < 1, \gamma > 0),$$

where, β is a first constant tuning parameter, and γ is a second constant tuning parameter.

The method further comprises forming a weight matrix of the global diffused weights by selecting each q-parameter based on:

$$q_k(i+1) = \begin{cases} q_k^{up} & \text{if } \zeta_k(i+1) > q_k^{up} \\ 1 & \text{if } \zeta_k(i+1) < 1 \\ \zeta_k(i+1) & \text{otherwise} \end{cases},$$

where, $$q_k^{up} = \frac{2}{\mu \lambda_{max}^k}.$$

and $\lambda_{max}^k$ is a maximum eigenvalue of an input correlation matrix for the node k.

The second embodiment is illustrated with respect to FIGS. 1-9. The second embodiment describes a method of distributed estimation, performed by a computing device 120, using q-diffusion least mean squares (qDiff-LMS) to modify adaptive filter 130 weights in a decentralized wireless sensor network 102 of N nodes. The method comprises calculating an output, $y_k(i)$, of an adaptive filter 130 of each node k, based on a product of a measured position, $x_k(i)$ of the node k, and an estimate of a previous time instance weight, $w_k(i-1)$ of each adaptive filter 130, calculating, for each node, k, a desired response, $d_k(i)$, calculating, for each node k, an estimation error, $e_k^{ATC}(i)$ by subtracting the output, $y_k(i)$ from the desired response, $d_k(i)$, updating the local estimate of the previous time instance weight, $w_k(i-1)$, of the adaptive filter 130 at each node k by adding a portion of the estimation error to the previous time instance weight, thus generating a local estimate of a diffused weight, $\emptyset_k(i-1)$, receiving, at each node k, the local estimate of the diffused weight $\emptyset_k(i-1)$, from each neighboring node l, where l=1, 2, . . . , M, and combining the local estimates of the diffused weights in a linear combination, thus generating a global diffused weight, $w_k(i-1)$.

The method further comprises calculating the output of the adaptive filter 130 at each node based on:

$$y_k(i) = x_k(i)\emptyset_k(i-1)$$

where $x_k(i)$ is an input signal vector of size 1×M at the node k.

The estimation error, $e_k^{ATC}(i)$ is calculated based on: $e_k^{ATC}(i)=d_k^i(i)-x_k(i)w_k(i-1)$.

The method further comprises updating the local estimate of the previous time instance weight, $w_k(i-1)$, of the adaptive filter 130, by using a steepest descent optimization of a q-LMS algorithm.

The method further comprises applying a steepest descent optimization of a q-LMS algorithm to update each local estimate of the diffused weight $\emptyset_k^{(i-1)}$ based on:

$$\emptyset_k(i-1)=w_k(i-1)+\mu G_k x_k^T(i)e_k^{ATC}(i)$$

where $\mu$ is a fixed step size of the steepest descent optimization, $x_k^T(i)$ represents a transpose of $x_k(i)$, and $G_k$ is a diagonal matrix having q-parameters on a diagonal, where the diagonal is given by:

$$\text{diag}(G_k) = \left[\frac{(q_{k1}+1)}{2}, \frac{(q_{k2}+1)}{2}, \ldots, \frac{(q_{kM}+1)}{2}\right]^T.$$

The method further comprises modifying the matrix $G_k$ by the time varying q-parameter $G_k(i)$, wherein each diagonal, $\zeta_k(i+1)$, of matrix $G_k(i)$ is calculated based on:

$$\zeta_k(i+1)=\beta\zeta_k(i)+\gamma e_k^2(i), (0<\beta<1, \gamma>0),$$

where $\beta$ is a first constant tuning parameter, and $\gamma$ is a second constant tuning parameter.

The method further comprises generating the diagonal of the weight matrix $G_k(i)$ by selecting each q-parameter based on:

$$q_k(i+1) = \begin{cases} q_k^{up} & \text{if } \zeta_k(i+1) > q_k^{up} \\ 1 & \text{if } \zeta_k(i+1) < 1 \\ \zeta_k(i+1) & \text{otherwise} \end{cases}$$

where, $$q_k^{up} = \frac{2}{\mu \lambda_{max}^k}.$$

and $\lambda_{max}^k$ is a maximum eigenvalue of an input correlation matrix for the node k.

The method further comprises generating the global diffused weight, w, based on:

$$w = \sum_{l \in N_k} c_{kl} \emptyset_l(i-1)$$

where $c_{kl}$ is a combining coefficient equal to $1/N_k$, for each node k, and $N_k$ is a set of the nodes in the neighborhood of the node k.

The third embodiment is illustrated with respect to FIGS. 1-9. The third embodiment describes a system 100 for distributed estimation of adaptive filter 130 weights using q-diffusion least mean squares (qDiff-LMS) to modify adaptive filter 130 weights in a decentralized wireless sensor network 102 of N nodes, comprising a decentralized wireless sensor network 102 of N nodes, wherein each node k of the N nodes is defined by a position coordinate, $x_k(i)$, an adaptive filter 130 located in each node k of the N nodes, wherein the adaptive filter 130 is represented by a plurality of weights, a computing device 120 located in each node k, wherein the computing device 120 includes circuitry and program instructions, which when executed by at least one processor, are configured to calculate an output, $y_k(i)$, of the adaptive filter 130 of the node k, based on a product of a measured position, $x_k(i)$ of the node k, and an estimate of a previous time instance weight, $w(i-1)$ of each adaptive filter 130, calculate, for each node k, a desired response, $d_k(i)$, generate, for each node k, an estimation error, $e_k(i)$, by subtracting the output, $y_k(i)$ from the desired response, $d_k(i)$, generate one of a linear combination global diffused weights, $\emptyset_k(i-1)$, based on receiving at each node k, a local estimate of the previous time instance weight, $w(i-1)$ of an adaptive filter 130 of each neighboring node, l, where l=1, 2, ..., M, and a linear combination of global diffused weights, $\emptyset_k(i-1)$ is based on receiving, at each node k, a local estimate of the diffused weight, $\emptyset_k(i-1)$ calculated by each neighboring node l, and updating one or more of the previous time instance weights, $w_k(i-1)$, of each adaptive filter 130, and the local estimate of the diffused weights $\emptyset_k(i-1)$.

The computing device 120 is further configured to calculate the output of the adaptive filter 130 at each node k based on:

$$y_k(i)=x_k(i)\emptyset_k(i-1)$$

where $x_k(i)$ is an input signal vector of size 1×M at the node k.

The computing device 120 is further configured to, when the linear combination global diffused weights, $\emptyset_k(i-1)$ is based on receiving the local estimate of the previous time instance weight, $w_k(i-1)$ calculate the estimation error, $e_k^{CTA}$ for each node k based on: $e_k^{CTA}(i)=d_k^i(i)-x_k(i)w_k(i-1)$, apply a steepest descent optimization of a q-LMS algorithm to update each previous time instance weight, $w_k(i-1)$, of the linear combination of the global diffused weights, $\emptyset_k(i-1)$, to an updated weight $w_k(i)$, such that each updated weight $w_k(i)$ is given by:

$$w_k(i)=\emptyset_k(i-1)+\mu G_k x_k^T(i)e_k^{CTA}(i)$$

where $\mu$ is a fixed step size of the steepest descent optimization, $x_k^T(i)$ represents a transpose of $x_k(i)$, and $G_k$ is a diagonal matrix having q-parameters on a diagonal, where the diagonal is given by:

$$\text{diag}(G_k) = \left[\frac{(q_{k1}+1)}{2}, \frac{(q_{k2}+1)}{2}, \ldots, \frac{(q_{kM}+1)}{2}\right]^T;$$

modify the matrix $G_k$ by a time varying q-parameter $G_k(i)$, wherein each eigenvalue, $\zeta_k(i+1)$, of matrix $G_k(i)$ is calculated based on:

$$\zeta_k(i+1)=\beta\zeta_k(i)+\gamma e_k^2(i), (0<\beta<1, \gamma>0),$$

where, $\beta$ is a first constant tuning parameter, and $\gamma$ is a second constant tuning parameter.

The computing device 120 is further configured to, when the linear combination global diffused weights, $\emptyset_k(i-1)$ is based on the local estimate of the diffused weight $\emptyset_l(i-1)$: calculate the estimation error, $e_k(i)$ for each node k based on: $e_k^{ATC}(i)=d_k^i(i)-x_k(i)w_k(i-1)$; apply a steepest descent optimization of a q-LMS algorithm to update each local estimate of the diffused weight $\emptyset_k(i-1)$ based on $$\emptyset_k(i-1)=w_k(i-1)+\mu G_k x_k^T(i)e_k^{ATC}(i),$$

where μ is a fixed step-size of the steepest descent optimization, $x_k^T(i)$ represents a transpose of $x_k(i)$, and $G_k$ is a diagonal matrix having q-parameters on a diagonal, where the diagonal is given by $$\text{diag}(G_k) = \left[\frac{(q_{k1}+1)}{2}, \frac{(q_{k2}+1)}{2}, \dots, \frac{(q_{kM}+1)}{2}\right]^T;$$

modify the matrix $G_k$ by the time varying q-parameter $G_k(i)$, wherein each diagonal, $\zeta_k(i+1)$, of matrix $G_k(i)$ is calculated based on $$\zeta_k(i+1) = \beta\zeta_k(i) + \gamma e_k^2(i), (0<\beta<1, \gamma>0),$$

where, β is a first constant tuning parameter, and γ is a second constant tuning parameter.

The computing device 120 is further configured to calculate a diagonal matrix $G_k$ having q-parameters on a diagonal, where the diagonal is given by:

$$\text{diag}(G_k) = \left[\frac{(q_{k1}+1)}{2}, \frac{(q_{k2}+1)}{2}, \dots, \frac{(q_{kM}+1)}{2}\right]^T;$$

form a weight matrix of the global diffused weights by selecting each q-parameter based on:

$$q_k(i+1) = \begin{cases} q_k^{up} & \text{if } \zeta_k(i+1) > q_k^{up} \\ 1 & \text{if } \zeta_k(i+1) < 1 \\ \zeta_k(i+1) & \text{otherwise} \end{cases}$$

where, $$q_k^{up} = \frac{2}{\mu \lambda_{max}^k}.$$

and $\lambda_{max}^k$ is a maximum eigenvalue of an input correlation matrix for the node k.

The computing device 120 is further configured to generate a cost function, J(w), of the weights of the adaptive filter 130 of the N nodes in the decentralized wireless sensor network 102, minimize the cost function, J(w), based on $$\min_w J(w) = E[\|d - Xw\|^2],$$

where E is an expectation operator of an absolute value of a least mean square error of the estimated output.

Figure 10:
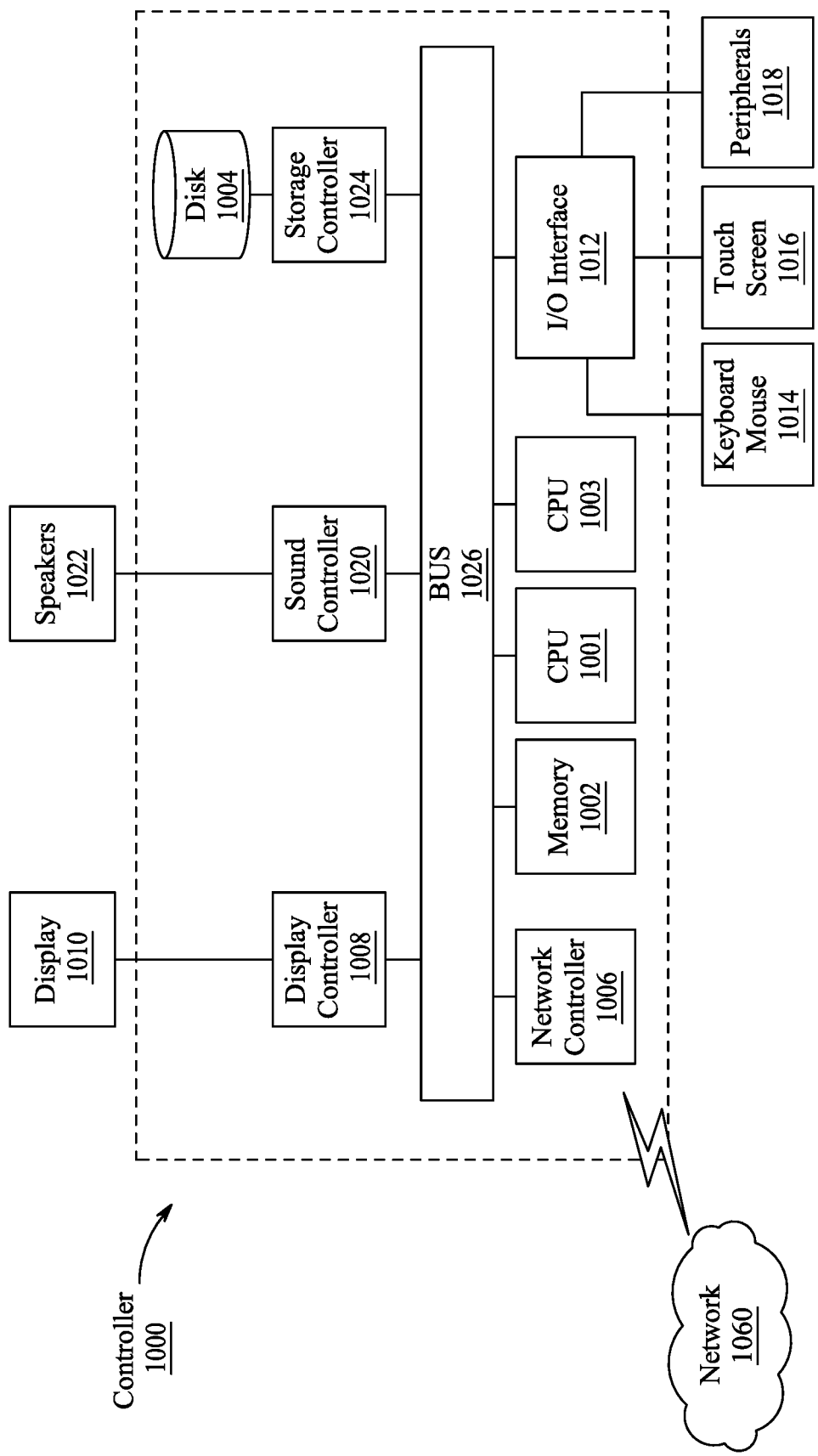
FIG. 10 is an illustration of a non-limiting example of details of computing hardware used in the computing device, according to aspects of the present disclosure.

Next, further details of the hardware description of the computing environment according to exemplary embodiments is described with reference to FIG. 10. FIG. 10 is an illustration of a non-limiting example of details of computing hardware used in the aforementioned computing device 120, according to exemplary aspects of the present disclosure. In FIG. 10, a controller 1000 is described which represents the computing device 120 as described above and which includes a CPU 1001 which performs the processes described above/below. The process data and instructions may be stored in memory 1002. These processes and instructions may also be stored on a storage medium disk 1004 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device 120 communicates, such as a server or computer.

Further, the claims may be provided as a utility application, background daemon, or component of an operating system, or combination thereof, executing in conjunction with CPU 1001, 1003 and an operating system such as Microsoft Windows 7, UNIX, Solaris, LINUX, Apple MAC-OS, and other systems known to those skilled in the art.

The hardware elements in order to achieve the computing device 120 may be realized by various circuitry elements, known to those skilled in the art. For example, CPU 1001 or CPU 1003 may be a Xenon or Core processor from Intel of America or an Opteron processor from AMD of America, or may be other processor types that would be recognized by one of ordinary skill in the art. Alternatively, the CPU 1001, 1003 may be implemented on an FPGA, ASIC, PLD or using discrete logic circuits, as one of ordinary skill in the art would recognize. Further, CPU 1001, 1003 may be implemented as multiple processors cooperatively working in parallel to perform the instructions of the inventive processes described above.

The computing device 120 also includes a network controller 1006, such as an Intel Ethernet PRO network interface card from Intel Corporation of America, for interfacing with network 1060. As can be appreciated, the network 1060 can be a public network, such as the Internet, or a private network such as an LAN or WAN network, or any combination thereof and can also include PSTN or ISDN sub-networks. The network 1060 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device 120 further includes a display controller 1008, such as a NVIDIA GeForce GTX or Quadro graphics adaptor from NVIDIA Corporation of America for interfacing with display 1010, such as a Hewlett Packard HPL2445w LCD monitor. A general purpose I/O interface 1012 interfaces with a keyboard and/or mouse 1014 as well as a touch screen panel 1016 on or separate from display 1010. General purpose I/O interface also connects to a variety of peripherals 1018 including printers and scanners, such as an OfficeJet or DeskJet from Hewlett Packard.

A sound controller 1020 is also provided in the computing device 120 such as Sound Blaster X-Fi Titanium from Creative, to interface with speakers/microphone 1022 thereby providing sounds and/or music.

The general-purpose storage controller 1024 connects the storage medium disk 1004 with communication bus 1026, which may be an ISA, EISA, VESA, PCI, or similar, for interconnecting all of the components of the computing device 120. A description of the general features and functionality of the display 1010, keyboard and/or mouse 1014, as well as the display controller 1008, storage controller 1024, network controller 1006, sound controller 1020, and general purpose I/O interface 1012 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 11.

Figure 11:
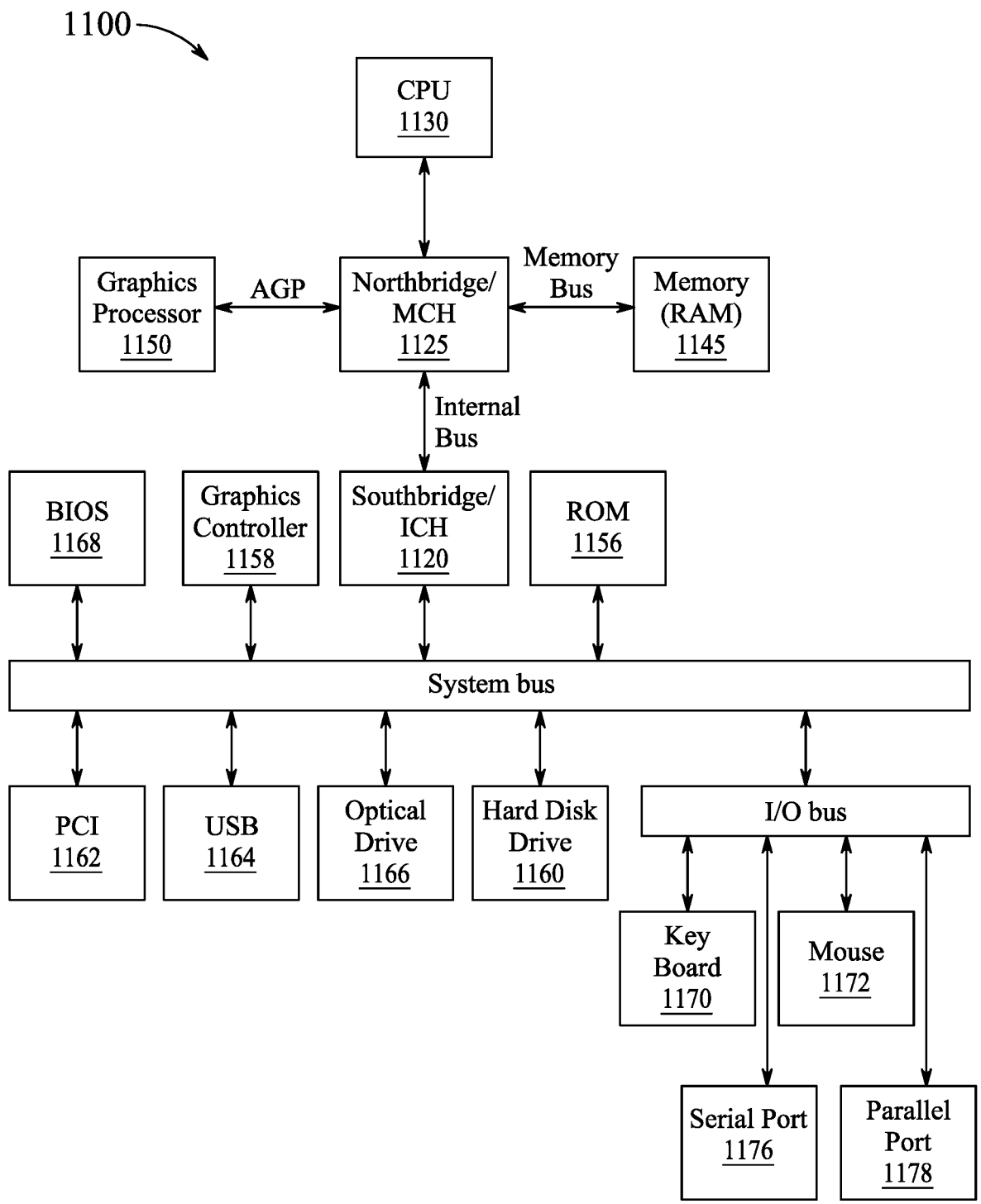
FIG. 11 is an exemplary schematic diagram of a data processing device used within the computing device, according to aspects of the present disclosure.

FIG. 11 shows a schematic diagram of a data processing system 1100 used within the computing system, according to exemplary aspects of the present disclosure. The data processing system 1100 is an example of a computer in which code or instructions implementing the processes of the illustrative aspects of the present disclosure may be located.

In FIG. 11, data processing system 1100 employs a hub architecture including a north bridge and memory controller hub (NB/MCH) 1125 and a south bridge and input/output (I/O) controller hub (SB/ICH) 1120. The central processing unit (CPU) 1130 is connected to NB/MCH 1125. The NB/MCH 1125 also connects to the memory 1145 via a memory bus, and connects to the graphics processor 1150 via an accelerated graphics port (AGP). The NB/MCH 1125 also connects to the SB/ICH 1120 via an internal bus (e.g., a unified media interface or a direct media interface). The CPU Processing unit 1130 may contain one or more processors and even may be implemented using one or more heterogeneous processor systems.

Figure 12:
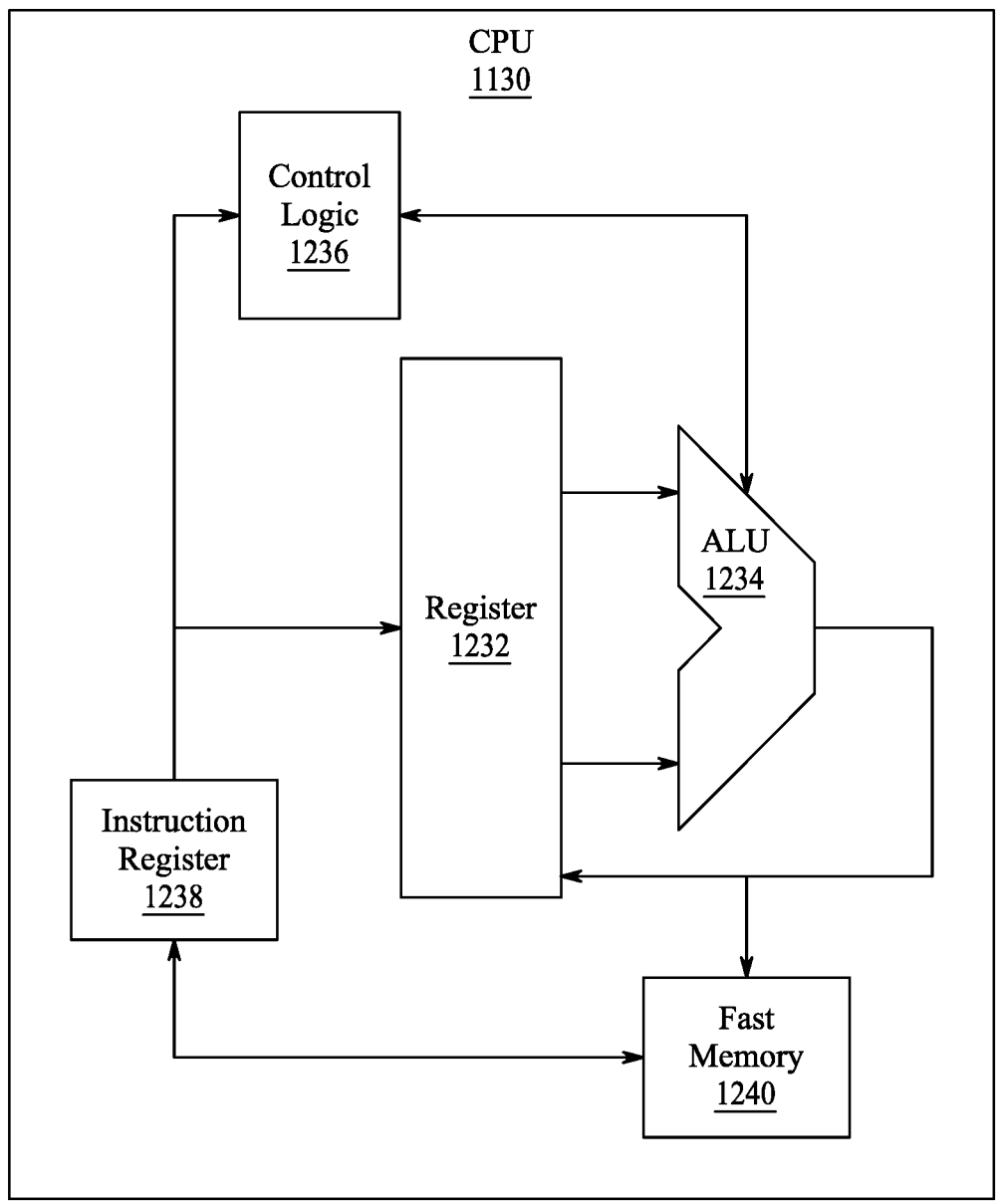
FIG. 12 is an exemplary schematic diagram of a processor used with the computing device, according to aspects of the present disclosure.

For example, FIG. 12 shows one aspects of the present disclosure of CPU 1130. In one aspects of the present disclosure, the instruction register 1238 retrieves instructions from the fast memory 1240. At least part of these instructions is fetched from the instruction register 1238 by the control logic 1236 and interpreted according to the instruction set architecture of the CPU 1130. Part of the instructions can also be directed to the register 1232. In one aspects of the present disclosure the instructions are decoded according to a hardwired method, and in another aspects of the present disclosure the instructions are decoded according a microprogram that translates instructions into sets of CPU configuration signals that are applied sequentially over multiple clock pulses. After fetching and decoding the instructions, the instructions are executed using the arithmetic logic unit (ALU) 1234 that loads values from the register 1232 and performs logical and mathematical operations on the loaded values according to the instructions. The results from these operations can be feedback into the register and/or stored in the fast memory 1240. According to certain aspects of the present disclosures, the instruction set architecture of the CPU 1130 can use a reduced instruction set architecture, a complex instruction set architecture, a vector processor architecture, a very large instruction word architecture. Furthermore, the CPU 1130 can be based on the Von Neuman model or the Harvard model. The CPU 1130 can be a digital signal processor, an FPGA, an ASIC, a PLA, a PLD, or a CPLD. Further, the CPU 1130 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 11, the data processing system 1100 can include that the SB/ICH 1120 is coupled through a system bus to an I/O Bus, a read only memory (ROM) 1156, universal serial bus (USB) port 1164, a flash binary input/output system (BIOS) 1168, and a graphics controller 1158. PCI/PCIe devices can also be coupled to SB/ICH 1120 through a PCI bus 1162.

The PCI devices may include, for example, Ethernet adapters, add-in cards, and PC cards for notebook computers. The Hard disk drive 1160 and CD-ROM 1156 can use, for example, an integrated drive electronics (IDE) or serial advanced technology attachment (SATA) interface. In one aspects of the present disclosure the I/O bus can include a super I/O (SIO) device.

Further, the hard disk drive (HDD) 1160 and optical drive 1166 can also be coupled to the SB/ICH 1120 through a system bus. In one aspects of the present disclosure, a keyboard 1170, a mouse 1172, a parallel port 1178, and a serial port 1176 can be connected to the system bus through the I/O bus. Other peripherals and devices that can be connected to the SB/ICH 1120 using a mass storage controller such as SATA or PATA, an Ethernet port, an ISA bus, an LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 13:
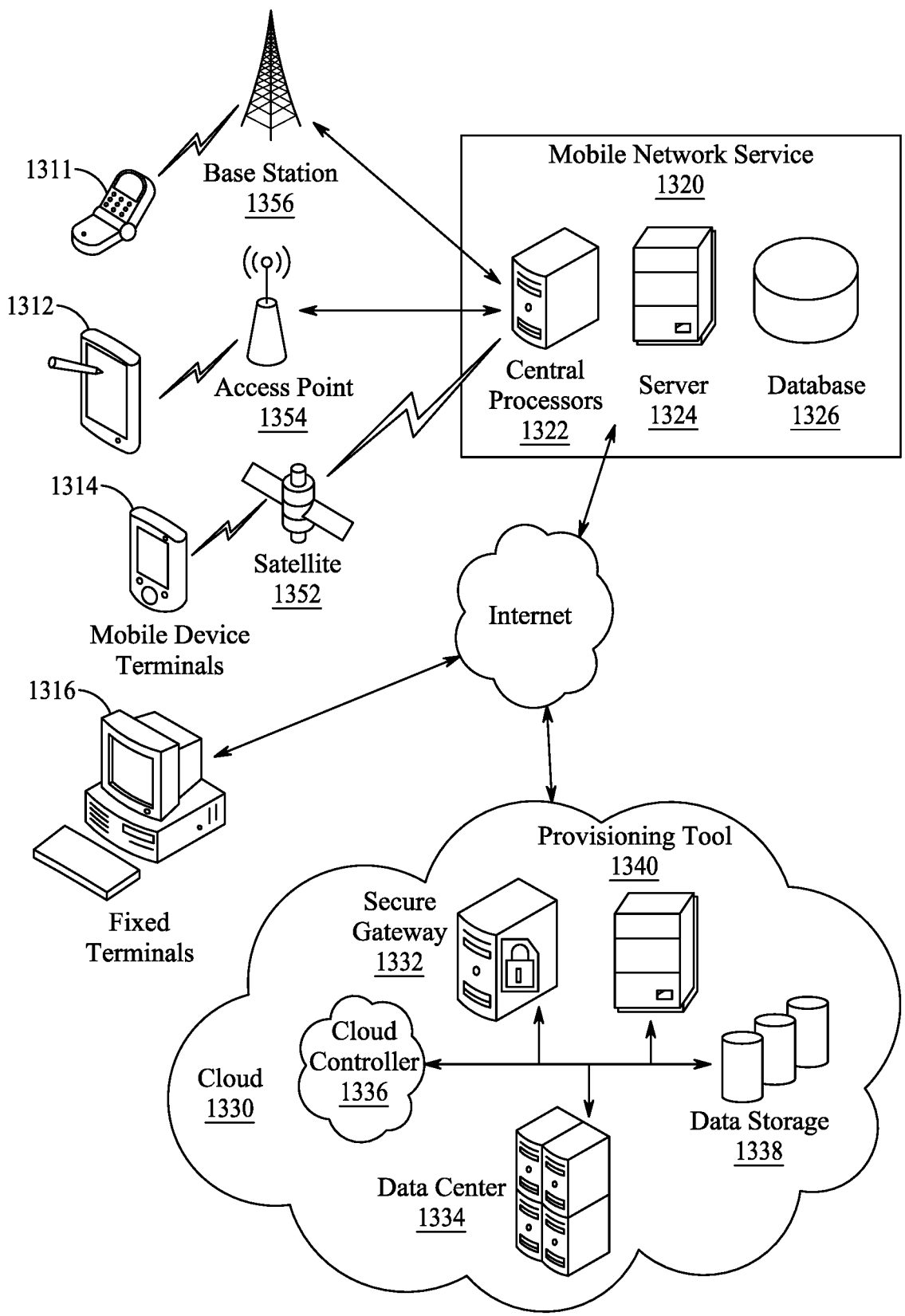
FIG. 13 is an illustration of a non-limiting example of distributed components which may share processing with the controller, according to aspects of the present disclosure.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 13, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some aspects of the present disclosures may be performed on modules or hardware not identical to those described. Accordingly, other aspects of the present disclosures are within the scope that may be claimed.

The above-described hardware description is a non-limiting example of a corresponding structure for performing the functionality described herein.

Obviously, numerous modifications and variations of the present disclosure are possible in light of the above teachings. It is therefore to be understood that within the scope of the appended claims, the disclosure may be practiced otherwise than as specifically described herein.

The invention claimed is:

1. A method of distributed estimation using q-diffusion least mean squares (qDiff-LMS) to modify adaptive filter weights in a decentralized wireless sensor network of N nodes, comprising:

receiving, at each node, k, a local estimate of a previous time instance weight, $w_k(i-1)$, of an adaptive filter of each neighboring node, l, where l=1, 2, . . . , M;

combining the local estimates of the previous time instance weights to generate a linear combination of global diffused weights, $\emptyset_k(i-1)$;

measuring, for each node k, an output, $y_k(i)$, of the adaptive filter of the node k;

calculating, for each node k, a desired response, $d_k(i)$;

generating, for each node k, an estimation error, $e_k^{CTA}(i)$ by subtracting the output, $y_k(i)$ from the desired response, $d_k(i)$; and updating the global diffused weights by adding a portion of the estimated error to the global diffused weights.

2. The method of claim 1, further comprising:
generating the linear combination of global diffused weights, $\emptyset_k(i-1)$, based on:

$$\emptyset_k(i-1) = \sum_{l \in N_k} c_{kl} w_l(i-1)$$

where $c_{kl}$ is a combining coefficient equal to $1/N_k$, for each node k, where $N_k$ is a sum of the nodes in the neighborhood of the node k.

3. The method of claim 2, further comprising:
calculating the output $y_k(i)$ of the adaptive filter at each node k based on:

$$y_k(i) = x_k(i) \emptyset_k(i-1)$$

where $x_k(i)$ is an input signal vector of size 1×M at the node k.

4. The method of claim 3, further comprising:
applying a steepest descent optimization of a q-LMS algorithm to update each previous time instance weight, $w_k(i-1)$, of the linear combination of the global diffused weights, $\emptyset_k(i-1)$, to an updated weight $w_k(i)$, such that each updated weight $w_k(i)$ is given by:

$$w_k(i) = \emptyset_k(i-1) + \mu G_k x_k^T(i) e_k^{CTA}(i)$$

where $\mu$ is a fixed step-size of the steepest descent optimization, $x_k^T$ represents a transpose of $x_k(i)$, and $G_k$ is a diagonal matrix having q-parameters on a diagonal, where the diagonal is given by:

$$\mathrm{diag}(G_k) = \left[ \frac{(q_{k1}+1)}{2}, \frac{(q_{k2}+1)}{2}, \ldots, \frac{(q_{kM}+1)}{2} \right]^T.$$

5. The method of claim 4, further comprising:
modifying the matrix $G_k$ by a time varying q-parameter $G_k(i)$, wherein each eigenvalue, $\zeta_k(i+1)$, of matrix $G_k(i)$ is calculated based on:

$$\zeta_k(i+1) = \beta \zeta_k(i) + \gamma e_k^2(i), \text{ for } (0 < \beta < 1, \gamma > 0),$$

where $\beta$ is a first constant tuning parameter, and $\gamma$ is a second constant tuning parameter.

6. The method of claim 5, further comprising:
forming a weight matrix of the global diffused weights by selecting each q-parameter based on:

$$q_k(i+1) = \begin{cases} q_k^{up} & \text{if } \zeta_k(i+1) > q_k^{up} \\ 1 & \text{if } \zeta_k(i+1) < 1, \\ \zeta_k(i+1) & \text{otherwise} \end{cases}$$

where, $$q_k^{up} = \frac{2}{\mu \lambda_{max}^k}.$$

and $\lambda_{max}^k$ is a maximum eigenvalue of an input correlation matrix for the node k.

7. A method of distributed estimation using q-diffusion least mean squares (qDiff-LMS) to modify adaptive filter weights in a decentralized wireless sensor network of N nodes, comprising:

calculating an output, $y_k(i)$, of an adaptive filter of each node k, based on a product of a measured position, $x_k(i)$ of the node k, and an estimate of a previous time instance weight, $w_k(i-1)$ of each adaptive filter;

calculating, for each node, k, a desired response, $d_k(i)$;

calculating, for each node k, an estimation error, $e_k^{ATC}(i)$ by subtracting the output, $y_k(i)$ from the desired response, $d_k(i)$;

updating the local estimate of the previous time instance weight, $w_k(i-1)$, of the adaptive filter at each node k by adding a portion of the estimation error to the previous time instance weight, thus generating a local estimate of a diffused weight, $\emptyset_k(i-1)$;

receiving, at each node k, the local estimate of the diffused weight $\emptyset_l(i-1)$ from each neighboring node l, where l=1, 2, ..., M; and combining the local estimates of the diffused weights $\emptyset_k(i-1)$ in a linear combination, thus generating a global diffused weight, w.

8. The method of claim 7, further comprising:
calculating the output of the adaptive filter at each node based on:

$$y_k(i) = x_k(i) \emptyset_k(i-1)$$

where $x_k(i)$ is an input signal vector of size 1×M at the node k.

9. The method of claim 8, wherein the estimation error, $e_k^{ATC}(i)$ is calculated based on: $e_k^{ATC}(i) = d_k^i(i) - x_k(i) w_k(i-1)$.

10. The method of claim 9, further comprising:
updating the local estimate of the previous time instance weight, $w_k(i-1)$, of the adaptive filter, by using a steepest descent optimization of a q-LMS algorithm.

11. The method of claim 9, further comprising:
applying a steepest descent optimization of a q-LMS algorithm to update each local estimate of the diffused weight $\emptyset_k(i-1)$ based on:

$$\emptyset_k(i-1) = w_k(i-1) + \mu G_k x_k^T(i) e_k^{ATC}(i)$$

where $\mu$ is a fixed step size of the steepest descent optimization, $x_k^T(i)$ represents a transpose of $x_k(i)$, and $G_k$ is a diagonal matrix having q-parameters on a diagonal, where the diagonal is given by:

$$\mathrm{diag}(G_k) = \left[ \frac{(q_{k1}+1)}{2}, \frac{(q_{k2}+1)}{2}, \ldots, \frac{(q_{kM}+1)}{2} \right]^T.$$

12. The method of claim 11, further comprising:
modifying the matrix $G_k$ by the time varying q-parameter $G_k(i)$, wherein each diagonal, $\zeta_k(i+1)$, of matrix $G_k(i)$ is calculated based on:

$$\zeta_k(i+1) = \beta \zeta_k(i) + \gamma e_k^2(i), (0 < \beta < 1, \gamma > 0),$$

where $\beta$ is a first constant tuning parameter, and $\gamma$ is a second constant tuning parameter.

13. The method of claim 12, further comprising:
generating the diagonal of the weight matrix $G_k(i)$ by selecting each q-parameter based on:

$$q_k(i+1) = \begin{cases} q_k^{up} & \text{if } \zeta_k(i+1) > q_k^{up} \\ 1 & \text{if } \zeta_k(i+1) < 1, \\ \zeta_k(i+1) & \text{otherwise} \end{cases}$$

where, $$q_k^{up} = \frac{2}{\mu \lambda_{max}^k}.$$

and $\lambda_{max}^k$ is a maximum eigenvalue of an input correlation matrix for the node k.

14. The method of claim 13, further comprising:
generating the global diffused weight, W, based on:

$$W = \sum_{l \in N_k} c_{kl} \emptyset_l^{(i-1)}$$

where $c_{kl}$ is a combining coefficient equal to $1/N_k$, for each node k, and $N_k$ is a set of the nodes in the neighborhood of the node k.

15. A system for distributed estimation of adaptive filter weights using q-diffusion least mean squares (qDiff-LMS) to modify adaptive filter weights in a decentralized wireless sensor network of N nodes, comprising:
a decentralized wireless sensor network of N nodes, wherein each node k of the N nodes is defined by a position coordinate, $x_k(i)$;
an adaptive filter located in each node k of the N nodes, wherein the adaptive filter is represented by a plurality of weights:
a computing device located in each node k, wherein the computing device includes circuitry and program instructions, which when executed by at least one processor, are configured to:
calculate an output, $y_k(i)$, of the adaptive filter of the node k, based on a product of a measured position, $x_k(i)$ of the node k, and an estimate of a previous time instance weight, $w_k(i-1)$ of each adaptive filter;
calculate, for each node k, a desired response, $d_k(i)$;
generate, for each node k, an estimation error, $e_k(i)$, by subtracting the output, $y_k(i)$ from the desired response, $d_k(i)$;
generate one of:
a linear combination of global diffused weights, $\emptyset_k(i-1)$ based on receiving, at each node k, a local estimate of a previous time instance weight, $w_k(i-1)$, of an adaptive filter of each neighboring node, l, where l=1, 2, ..., M, and
a linear combination of global diffused weights, $\emptyset_k(i-1)$ based on receiving, at each node k, a local estimate of the diffused weight $\emptyset_l(i-1)$ calculated by each neighboring node l; and
updating one or more of the previous time instance weights, $w_k(i-1)$ of each adaptive filter, and the local estimate of the diffused weights $\emptyset_l(i-1)$.

16. The system of claim 15, wherein the computing device is further configured to calculate the output of the adaptive filter at each node k based on:

$$y_k(i) = x_k(i) \emptyset_l(i-1)$$

where $x_k(i)$ is an input signal vector of size 1×M at the node k.

17. The system of claim 16, wherein the computing device is further configured to, when the linear combination global diffused weights, $\emptyset_k(i-1)$ is based on receiving the local estimate of the previous time instance weight, $w_k(i-1)$:
calculate the estimation error, $e_k^{CTA}(i)$ for each node k based on: $e_k^{CTA}(i) = d_k^i(i) - x_k(i) w_k(i-1)$;
apply a steepest descent optimization of a q-LMS algorithm to update each previous time instance weight, $w_k(i-1)$, of the linear combination of the global diffused weights, $\emptyset_k(i-1)$, to an updated weight $w_k(i)$, such that each updated weight $w_k(i)$ is given by: $w_k(i) = \emptyset_k(i-1) + \mu G_k x_k^T(i) e_k^{CTA}(i)$, where $\mu$ is a fixed step size of the steepest descent optimization, $x_k^T(i)$ represents a transpose of $x_k(i)$, and $G_k$ is a diagonal matrix having q-parameters on a diagonal, where the diagonal is given by:

$$\text{diag}(G_k) = \left[ \frac{(q_{k1}+1)}{2}, \frac{(q_{k2}+1)}{2}, \ldots, \frac{(q_{kM}+1)}{2} \right]^T;$$

modify the matrix $G_k$ by a time varying q-parameter $G_k(i)$, wherein each eigenvalue, $\zeta_k(i+1)$, of matrix $G_k(i)$ is calculated based on:
$\zeta_k(i+1) = \beta \zeta_k(i) + \gamma e_k^T(i), (0 < \beta < 1, \gamma > 0)$,
where, $\beta$ is a first constant tuning parameter, and $\gamma$ is a second constant tuning parameter.

18. The system of claim 16, wherein the computing device is further configured to, when the linear combination global diffused weights, $\emptyset_k(i-1)$ is based on the local estimate of the diffused weight $\emptyset_l(i-1)$:
calculate the estimation error, $e_k(i)$ for each node k based on: $e_k^{ATC}(i) = d_k^i(i) - x_k(i) w_k(i-1)$;
apply a steepest descent optimization of a q-LMS algorithm to update each local estimate of the diffused weight $\emptyset_k(i-1)$ based on
$\emptyset_k(i-1) = w_k(i-1) + \mu G_k x_k^T(i) e_k^{ATC}(i)$,
where $\mu$ is a fixed step size of the steepest descent optimization, $x_k^T(i)$ represents a transpose of $x_k(i)$, and $G_k$ is a diagonal matrix having q-parameters on a diagonal, where the diagonal is given by $$\text{diag}(G_k) = \left[ \frac{(q_{k1}+1)}{2}, \frac{(q_{k2}+1)}{2}, \ldots, \frac{(q_{kM}+1)}{2} \right]^T;$$

modify the matrix $G_k$ by the time varying q-parameter $G_k(i)$, wherein each diagonal, $\zeta_k(i+1)$, of matrix $G_k(i)$ is calculated based on
$\zeta_k(i+1) = \beta \zeta_k(i) + \gamma e_k^2(i), (0 < \beta < 1, \gamma > 0)$,
where, $\beta$ is a first constant tuning parameter, and $\gamma$ is a second constant tuning parameter.

19. The system of claim 16, wherein the computing device is further configured to:
calculate a diagonal matrix $G_k$ having q-parameters on a diagonal, where the diagonal is given by:

$$\text{diag}(G_k) = \left[ \frac{(q_{k1}+1)}{2}, \frac{(q_{k2}+1)}{2}, \ldots, \frac{(q_{kM}+1)}{2} \right]^T;$$

form a weight matrix of the global diffused weights by selecting each q-parameter based on:

$$q_k(i+1) = \begin{cases} q_k^{up} & \text{if } \zeta_k(i+1) > q_k^{up} \\ 1 & \text{if } \zeta_k(i+1) < 1, \\ \zeta_k(i+1) & \text{otherwise} \end{cases}$$

where, $$q_k^{up} = \frac{2}{\mu \lambda_{max}^k}.$$

and $\lambda_{max}^k$ is a maximum eigenvalue of an input correlation matrix for the node k.

20. The system of claim 16, wherein the computing device is further configured to:
generate a cost function, J(w), of the weights of the adaptive filters of the N nodes in the decentralized wireless sensor network;
minimize the cost function, J(w), based on $$\min_w J(w) = E[\|d - Xw\|^2],$$

where E is an expectation operator of an absolute value of a least mean square error of the estimated output.

* * * * *